United States Patent [19]

Crane, Jr. et al.

[11] Patent Number: 5,543,586
[45] Date of Patent: Aug. 6, 1996

[54] APPARATUS HAVING INNER LAYERS SUPPORTING SURFACE-MOUNT COMPONENTS

[75] Inventors: Stanford W. Crane, Jr., Boca Raton; Maria M. Portuondo, Delray Beach, both of Fla.

[73] Assignee: The Panda Project, Boca Raton, Fla.

[21] Appl. No.: 208,519

[22] Filed: Mar. 11, 1994

[51] Int. Cl.$^6$ .................................................. H05K 1/02
[52] U.S. Cl. ...................... 174/262; 361/760; 361/776; 174/260; 174/266
[58] Field of Search .................................. 174/262, 259, 174/260, 263, 264, 265, 266; 361/760, 776, 784, 792

[56] References Cited

U.S. PATENT DOCUMENTS

| | | |
|---|---|---|
| 3,337,838 | 8/1967 | Damiano et al. . |
| 3,366,915 | 1/1968 | Miller . |

(List continued on next page.)

FOREIGN PATENT DOCUMENTS

| | | |
|---|---|---|
| 0467698 | 1/1992 | European Pat. Off. . |
| 0520434A1 | 12/1992 | European Pat. Off. . |
| 1936899 | 2/1971 | Germany . |
| 3737819A1 | 5/1988 | Germany . |
| 1-164089 | 6/1989 | Japan . |
| 3-58491 | 3/1991 | Japan . |
| 483182 | 12/1969 | Switzerland . |

OTHER PUBLICATIONS

George D. Gregoire, "3–Dimensional Circuitry Solves Fine Pitch SMT Device Assembly Problem:" Connection Technology.
Dimensional Circuits Corporation, "Dimensional Circuits Corp". Awarded Two U.S. Patents. D.C.C. News, Apr. 5, 1994.
George D. Gregoire, "Very Fine Line Recessed Circuitry—A New PCB Fabrication Process".
IBM Technical Disclosure Bulletin, "Mounting Technique For Surface Components," vol. 31, No. 7, Dec. 1988.
Robert Barnhouse, "Bifurcated Through–Hole Technology—An Innovative Solution to Circuit Density," Connection Technology, pp. 33–35 (Feb., 1992).
"AMP–ASC Interconnection Systems," AMP Product Information Bulletin, pp. 1–4 (1991).
"Micro–Strip Interconnection System," AMP Product Guide, pp. 3413–3414 (Jun., 1991).
"Rib-Cage II Through–Mount Shrouded Headers" and Micropax Board–to–Board Interconnect System, Du Pont Connector Systems Product Catalog A, pp. 2–6, 3–0, 3–1 (Feb., 1992).
R. R. Tummala et al., "Microelectronics Packaging Handbook," Van Nostrand Reinhold, 1989, pp. 38–43, 398–403, 779–791, 853–859, and 900–905.
"Packaging," Intel Corporation, 1993, pp. 2–36, 2–96, 2–97, 2–100, 3–2, 3–24, and 3–25.

*Primary Examiner*—Laura Thomas
*Attorney, Agent, or Firm*—Morgan, Lewis and Bockius LLP

[57] ABSTRACT

An apparatus comprising a multi-layer substrate including a plurality of layers of insulative material, at least one well formed in at least one of the layers, the well extending from an outer surface of the multi-layer substrate to an inner surface of the multi-layer substrate, and an electrically conductive component formed within the well on the inner surface of the multi-layer substrate; and a device having at least one electrically conductive lead or wire extending into the well and being in direct physical contact with the electrically conductive component formed on the inner surface of the multi-layer substrate. Also, a method of manufacturing an apparatus comprising the steps of forming a multi-layer substrate including a plurality of layers of insulative material, at least one well formed in at least one of the layers, the well extending from an outer surface of the multi-layer substrate to an inner surface of the multi-layer substrate, and an electrically conductive component formed within the well on the inner surface of the multi-layer substrate; and extending at least one electrically conductive lead or wire from a device into the well such that the lead or wire is in direct physical contact with the electrically conductive component formed on the inner surface of the multi-layer substrate.

22 Claims, 18 Drawing Sheets

U.S. PATENT DOCUMENTS

| | | |
|---|---|---|
| 3,444,506 | 5/1969 | Wedekind . |
| 3,516,156 | 6/1970 | Steranko ................................. 174/262 |
| 3,875,479 | 4/1975 | Jaggar ............................. 317/101 CM |
| 4,487,463 | 12/1984 | Tillotson . |
| 4,572,604 | 2/1986 | Ammon et al. . |
| 4,616,406 | 10/1986 | Brown ....................................... 29/588 |
| 4,655,526 | 4/1987 | Shaffer . |
| 4,698,663 | 10/1987 | Sugimoto et al. ..................... 357/81 |
| 4,734,042 | 3/1988 | Martens et al. . |
| 4,787,853 | 11/1988 | Igarashi ................................... 439/55 |
| 4,897,055 | 1/1990 | Jurista et al. . |
| 4,943,846 | 7/1990 | Shirling ..................................... 357/80 |
| 4,959,750 | 9/1990 | Cnyrim et al. . |
| 4,975,066 | 12/1990 | Sucheski et al. . |
| 4,997,376 | 3/1991 | Buck et al. . |
| 5,037,311 | 8/1991 | Frankeny et al. . |
| 5,071,363 | 12/1991 | Reylek et al. ......................... 439/291 |
| 5,081,563 | 1/1992 | Feng et al. . |
| 5,117,069 | 6/1992 | Higins, III . |
| 5,123,164 | 6/1992 | Shaheen et al. . |
| 5,137,456 | 8/1992 | Desai et al. . |
| 5,281,151 | 1/1994 | Arima et al. ............................. 439/68 |
| 5,309,024 | 5/1994 | Hirano ................................... 257/773 |
| 5,326,936 | 7/1994 | Taniuchi et al. . |
| 5,334,279 | 8/1994 | Gregoire ................................. 156/630 |
| 5,342,999 | 8/1994 | Frei et al. . |
| 5,351,393 | 10/1994 | Gregoire ................................... 2.9/835 |
| 5,371,404 | 12/1994 | Juskey et al. ......................... 257/659 |
| 5,376,825 | 12/1994 | Tukamoto et al. ..................... 257/685 |
| 5,390,412 | 2/1995 | Gregoire ................................... 29/848 |

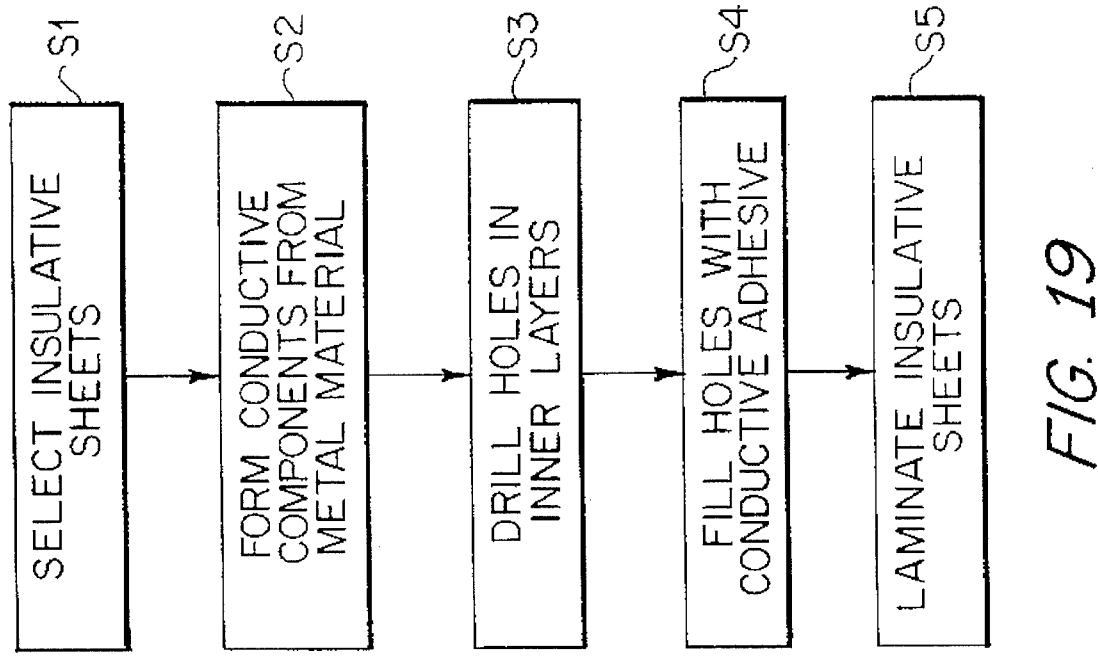
FIG. 19
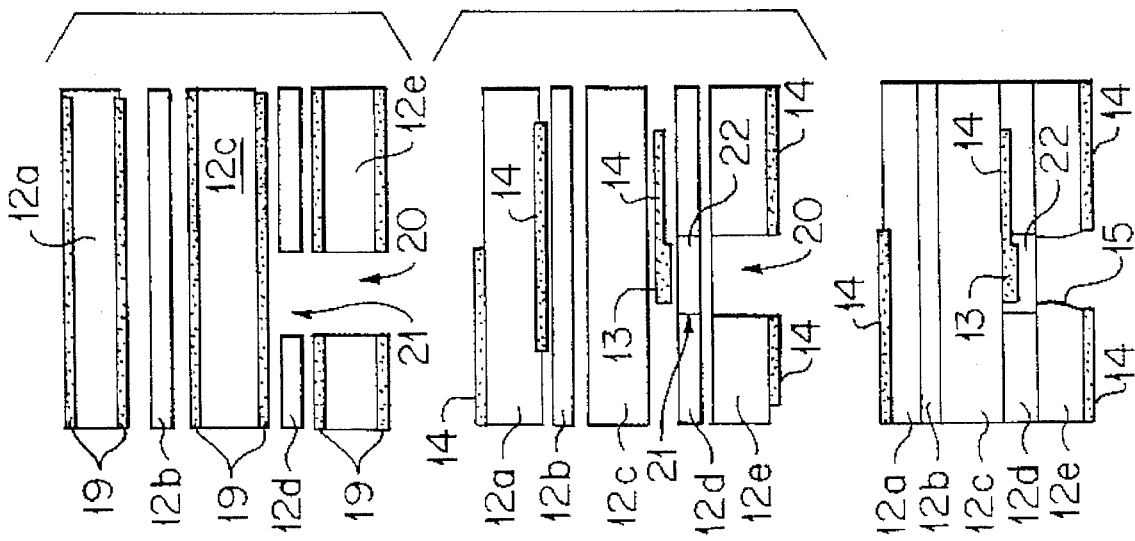
FIG. 18(a)
FIG. 18(b)
FIG. 18(c)

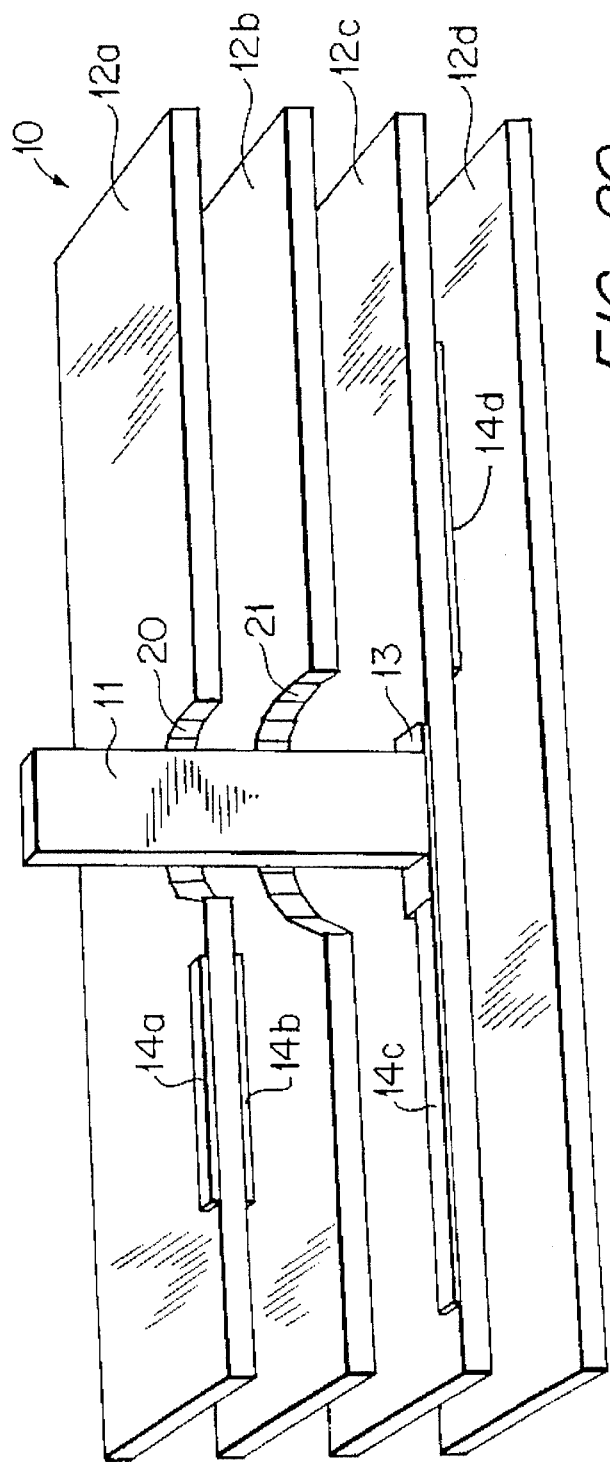
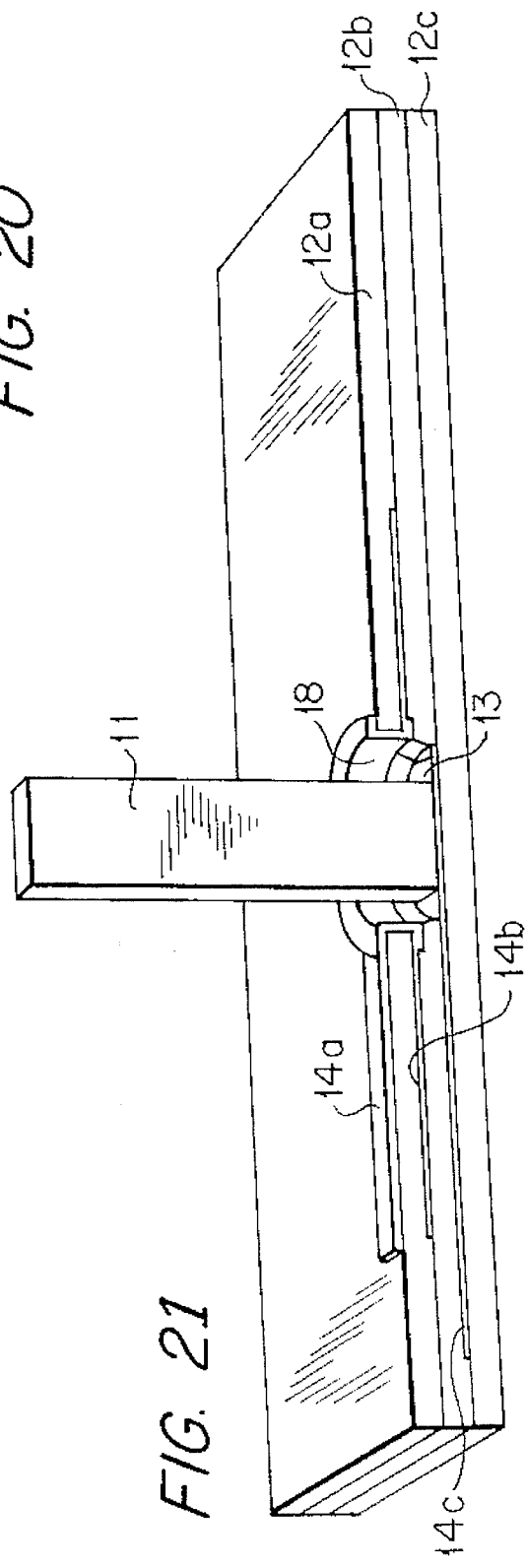

APPARATUS HAVING INNER LAYERS SUPPORTING SURFACE-MOUNT COMPONENTS

BACKGROUND OF THE INVENTION

1. Field of the Invention

The present invention relates to methods and apparatus for transmitting or conducting electrical signals from a conductive portion of a component, such as a lead or a wire, to an inner layer of a multi-layer substrate or board and, in particular, relates to the performing of such signal transmission or conduction without the use of vias, plated-through-holes, and the like. The present invention also relates to methods for manufacturing multi-layer substrates which are suitable for carrying out the aforementioned functions.

2. Description of the Related Art

Various methods are known for mounting semiconductor packages, resistors, capacitors, inductors, connectors, and other electrical or electronic components on an interface surface such as a printed circuit board (PCB). Two of the more common methods are the plated-through-hole (PTH) method and the surface-mount-technology (SMT) method.

In the PTH method, illustrated in FIG. 1, component mounting is accomplished by inserting a lead 101 of a component 102 through a PTH 103 formed in a PCB 104 and then soldering the lead to form a solder joint 105 fastening the lead in contact with the PTH. The PTH method is applicable for use in connection with both single-layer and multi-layer PCBs.

In the SMT method, illustrated in FIGS. 2(a)–2(d), each lead 101 of a component 102, rather than being soldered to extend through a PTH in a PCB, is soldered onto a conductive portion of a top surface of the PCB 104 known as a pad. If the component is a leadless chip carrier, as shown in FIG. 2(d), a conductive section of the component 102 is soldered onto the pad. A solder joint 105 then maintains each lead 101 of the leaded chip carriers, FIGS. 2(a)–2(c), or each conductive section of the leadless chip carrier, FIG. 2(d), in a fastened relationship with respect to the PCB 104. In accordance with the SMT method, each lead 101 of the leaded chip carriers can have a "Gullwing" configuration, as in FIG. 2(a); a "J-Lead" configuration, as in FIG. 2(b); or a "Butt Lead" configuration, as in FIG. 2(c).

An example of a conventional multi-layer PCB 104, with the individual layers of the PCB shown separated for ease of explanation, is shown in FIG. 3. In the example of FIG. 3, the lead 101a is a PTH lead of a component (not shown) which extends through a PTH 103 formed in the PCB 104 and which is soldered to form a solder joint 105 fastening the lead within the PTH. The PTH 103 extends through all of the layers of the PCB 104. In the example of FIG. 3, the lead 101b is an SMT lead of a component (not shown) mounted to a bonding pad 106 formed on the upper surface of the PCB 104.

Vias are used to interconnect layers of a multi-layer PCB. A via is a conventional component that is similar to the aforementioned PTH, except that a via is not typically large enough to accommodate receipt of a lead or the like therein. A via may extend through the layers of a multi-layer PCB to allow the transmission of signals between such layers.

Three types of conventional vias for a multi-layer PCB 104 are shown in FIG. 4. In FIG. 4, via 107a is a via extending through all of the layers of the PCB 104. Via 107b is a blind via extending from either the top or bottom of the PCB 104 through some, but not all, of the layers of the PCB. Only the side portions of a conventional blind via are plated with conductive material; the bottom portion is filled with insulative pre-preg or epoxy resin material rather than being plated. Via 107c is a buried via extending through only internal layers of the PCB 104; it does not extend all the way to the top or the bottom of the PCB.

The vias of FIG. 4 may be formed by a process wherein holes are drilled in each of the layers, the holes are plated, and then the layers are laminated together. Blind vias result when the layers are laminated such that a drilled portion of one layer abuts, at only one side thereof, an undrilled portion of another one of the layers. Buried vias result when the layers are laminated such that a drilled portion of one layer abuts, at both sides thereof, undrilled portions of other ones of the layers, respectively. The manufacturing process performed to achieve a PCB such as that shown in FIG. 4 is very expensive.

FIG. 5 is a side view of a multi-layer PCB 104. In FIG. 5, a lead 101 of a component (not shown) extends through a PTH 103 formed in the PCB and is soldered to form a solder joint (not shown) fastening the lead within the PTH. The PTH 103 extends through all of the layers of the PCB shown in FIG. 5. Also, in FIG. 5, a plated via 107 extends through all of the layers of the PCB 104. Conductive traces 108a, 108b, 108c, and 108d are formed on various layers of the PCB 104, respectively, and a number of the traces (for example, traces 108a and 108d) provide an electrically conductive path between the via 107 and the PTH 103. By virtue of the via 107, the PTH 103, and the various traces, an electrical signal may be transmitted, for example, between the PTH lead 101, the trace 108a formed on the top surface of the PCB 104, and one or more inner layers of the PCB.

FIG. 6 is a partial side view of a multi-layer PCB 104 incorporating an SMT pad 106, a plated via 107, and traces 108a, 108b, 108c, and 108d formed at various levels thereof, respectively. In FIG. 6, an SMT lead 101 of a component (not shown) is mounted to the bonding pad 106 formed on the top surface of the PCB. A conductive trace 108a formed on the upper surface of the PCB connects the bonding pad 106 and the via 107, allowing electrical signals to be transmitted between the SMT lead 101 and traces at various other levels of the PCB. As an example, the configuration illustrated in FIG. 6 allows the transmission of electrical signals between the SMT lead 101 and the trace 108d formed on the bottom surface of the PCB 104. It is important to note that for every SMT lead which connects to an inner layer of the PCB 104, there must be a trace and a via. Consequently, large amounts of area are sacrificed at the various levels of the PCB.

FIG. 7 is a partial perspective view of a conventional multi-layer PCB 104 with the individual layers of the board shown separated for ease of explanation. Like the PCB illustrated in FIG. 6, the PCB of FIG. 7 incorporates an SMT bonding pad 106, a plated via 107, and traces 108a and 108b formed at various levels thereof, respectively. In FIG. 7, an SMT lead 101 of a component (not shown) is mounted to the bonding pad 106.

Every conventional PCB known to the inventors makes inefficient use of its surface and inner layers. Current commercial production technology allows for 80 traces per linear inch of the PCB, based on 0.006 inch wide traces and requisite clearances. As the density of semiconductor packages and the like increases, it becomes more difficult for designers to efficiently convey signals between surfaces and inner layers of the PCB. Signals are currently brought to such inner layers by using traces which run to vias and thus are connected to the inner layers. These vias and related traces occupy a significant amount of area, reducing density and complicating signal routing. The problem is compounded when using advanced components having a large number of contacts per linear or square inch.

High-density interconnect technology is currently attempted by reducing the size of traces, PTHs, vias, and line spacing. In attempting to achieve high-density, the prior art contemplates the manufacture of PCBs with thinner traces placed closer together. Such attempts at high-density, however, may reduce manufacturing yields and increase costs due to the extreme tolerances that are necessary.

Conventional vias, while allowing the transmission of signals between various PCB layers, pose a number of electrical and mechanical problems. For example, large numbers of conventional vias add unwanted capacitance to the signal, power, and ground planes. Moreover, vias increase the number of drill operations required to manufacture a multi-layer PCB and, therefore, increase cost and reduce yield. The term "drill operation" is used herein to describe the number of vias times the number of board layers. Also, vias reduce the amount of available signal routing paths, and reduce the amount of PCB surface area available for the placement or mounting of component leads.

Routeability is especially affected in an adverse manner by the use of vias in connection with multi-layer PCBs. This is particularly true as the number of layers in a PCB increases. As an example, for each PCB layer through which a via extends, in addition to the space required for the via itself, space is also necessary for the traces required to connect the via to other conductive elements at each level. Moreover, each via must be of an increased size due to the conductive plating which the via requires to ensure that the via is capable of conducting electrical signals. Trace clearance between other components, pads, and other traces further reduces density.

As is evident from the foregoing, even though conventional PCBs may carry conductive elements at a number of levels, limitations on the acceptable spacing of traces, lines and, in particular, PTHs and plated vias, limit the density of the conductivity of conventional PCBs. Consequently, conventional PCBs are not sufficient to meet the needs of existing and/or future semiconductor and computer technology.

Existing PCB and other interface technology has already failed to keep pace with current semiconductor and computer technology, and as computer and microprocessor speeds continue to climb, with space efficiency and routeability becoming increasingly important, multi-layer substrates having more efficient interconnect characteristics will be required. The PCBs discussed above fall short of current and contemplated semiconductor-related and computer-related requirements.

SUMMARY OF THE INVENTION

Accordingly, it is a goal of the present invention to provide a multi-layer substrate allowing superior use of the surface and inner layers to afford higher density. The multi-layer substrate may be a multi-layer PCB, a ceramic multi-layer substrate, or some other type of multi-layer substrate.

Another goal of the present invention is to provide a multi-layer substrate which uses a lead, a wire, or the like, rather than a via formed in the multi-layer substrate, for transmitting electrical signals directly to the inner layers of the multi-layer substrate.

Yet another goal of the present invention is to provide a multi-layer substrate, including, for example, a multi-layer substrate within a semiconductor package, having inner layers which are SMT-compatible.

Still another goal of the present invention is to provide a multi-layer substrate having reduced capacitance, shorter signal paths, increased area for component placement and mounting, and improved routeability.

A further goal of the present invention is to provide a multi-layer substrate having increased manufacturing yields and decreased manufacturing costs.

It is also a goal of the present invention to provide methods of making and using multi-layer substrates having characteristics such as those discussed above.

These and other goals are achieved by using an apparatus comprising a multi-layer substrate including a plurality of layers of insulative material, at least one well formed in at least one of the layers, the well extending from an outer surface of the multi-layer substrate to an inner surface of the multi-layer substrate, and an electrically conductive component formed within the well on the inner surface of the multi-layer substrate; and a device having at least one electrically conductive lead or wire extending into the well and being in direct physical contact with the electrically conductive component formed on the inner surface of the multi-layer substrate. Also, a method of manufacturing an apparatus comprises the steps of forming a multi-layer substrate including a plurality of layers of insulative material, at least one well formed in at least one of the layers, the well extending from an outer surface of the multi-layer substrate to an inner surface of the multi-layer substrate, and an electrically conductive component formed within the well on the inner surface of the multi-layer substrate; and extending at least one electrically conductive lead or wire from a device into the well such that the lead or wire is in direct physical contact with the electrically conductive component formed on the inner surface of the multi-layer substrate.

It is to be understood that both the foregoing general description and the following detailed description are exemplary and explanatory, and are not restrictive of the invention as claimed. The accompanying drawings, which are incorporated in and constitute a part of the specification, illustrate embodiments of the present invention and, together with the general description, serve to explain the principles of the present invention.

BRIEF DESCRIPTION OF THE DRAWINGS

FIG. 18(a) is an example of a first stage in the manufacturing of a multi-layer substrate in accordance with the present invention having an unplated well.

FIG. 18(b) is an example of a second stage in the manufacturing of a multi-layer substrate in accordance with the present invention having an unplated well.

FIG. 18(c) is an example of a third stage in the manufacturing of a multi-layer substrate in accordance with the present invention having an unplated well.

FIG. 19 is a flow chart showing exemplary steps which may be performed to manufacture a multi-layer substrate in accordance with the present invention having an unplated well.

FIG. 20 is a partial perspective view of a multi-layer substrate in accordance with the present invention prior to soldering with the layers separated for ease of explanation.

FIG. 21 is a partial perspective view of a multi-layer substrate in accordance with the present invention after lamination with the solder not shown for ease of explanation.

DESCRIPTION OF THE PREFERRED EMBODIMENT

Figure 1:
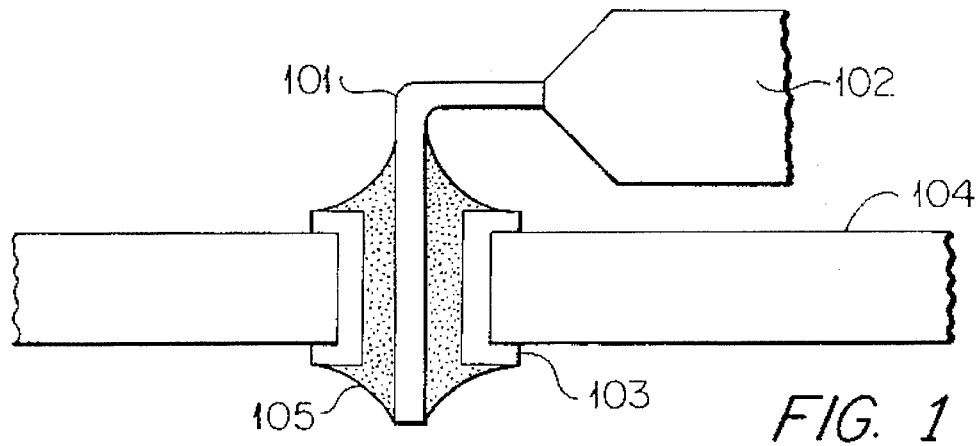
FIG. 1 is a side view illustrating aspects of conventional PTH technology.
Figure 2A:
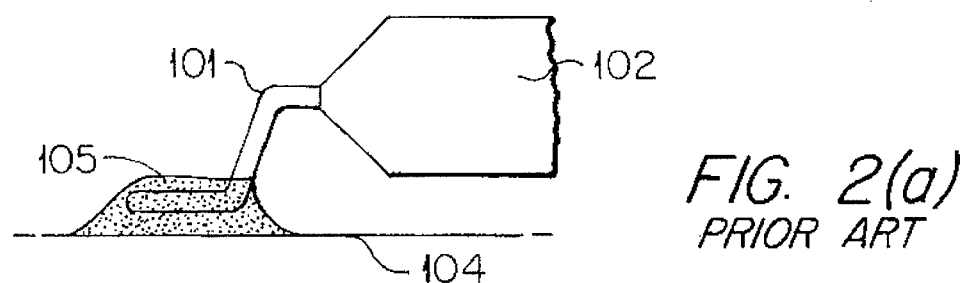
FIG. 2(a) is a side view illustrating conventional SMT methodology for use with a leaded chip carrier having leads of a Gullwing configuration.
Figure 2B:
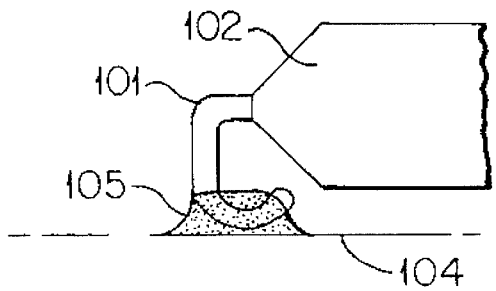
FIG. 2(b) is a side view illustrating conventional SMT methodology for use with a leaded chip carrier having leads of a J-Lead configuration.
Figure 2C:
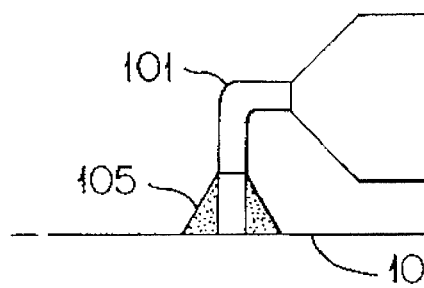
FIG. 2(c) is a side view illustrating conventional SMT methodology for use with a leaded chip carrier having leads of a Butt-Lead configuration.
Figure 2D:
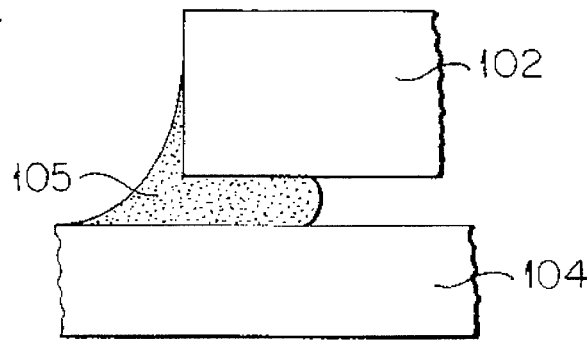
FIG. 2(d) is a side view illustrating conventional SMT methodology for use with a leadless chip carrier.
Figure 3:
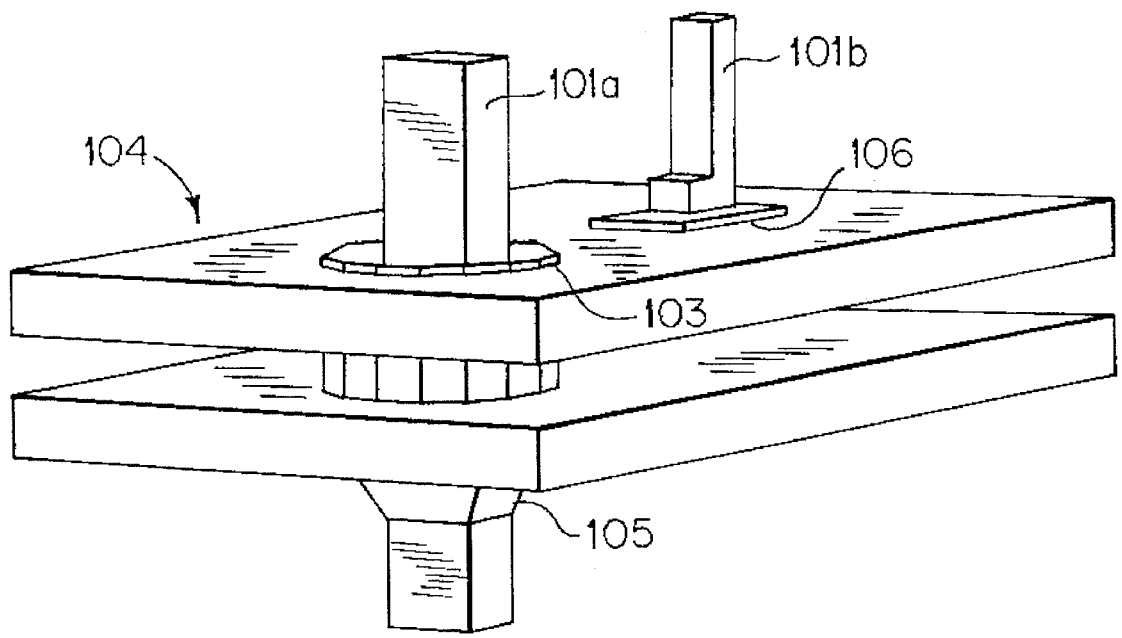
FIG. 3 is a partial perspective view of a conventional multi-layer PCB using PTH and SMT techniques with the layers separated for ease of explanation.
Figure 4:
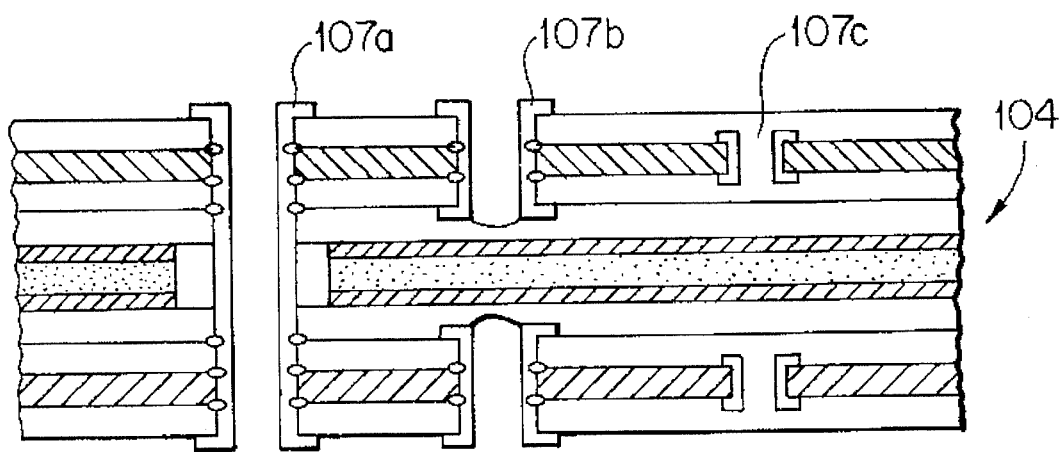
FIG. 4 is a side view illustrating aspects of conventional via technology.
Figure 5:
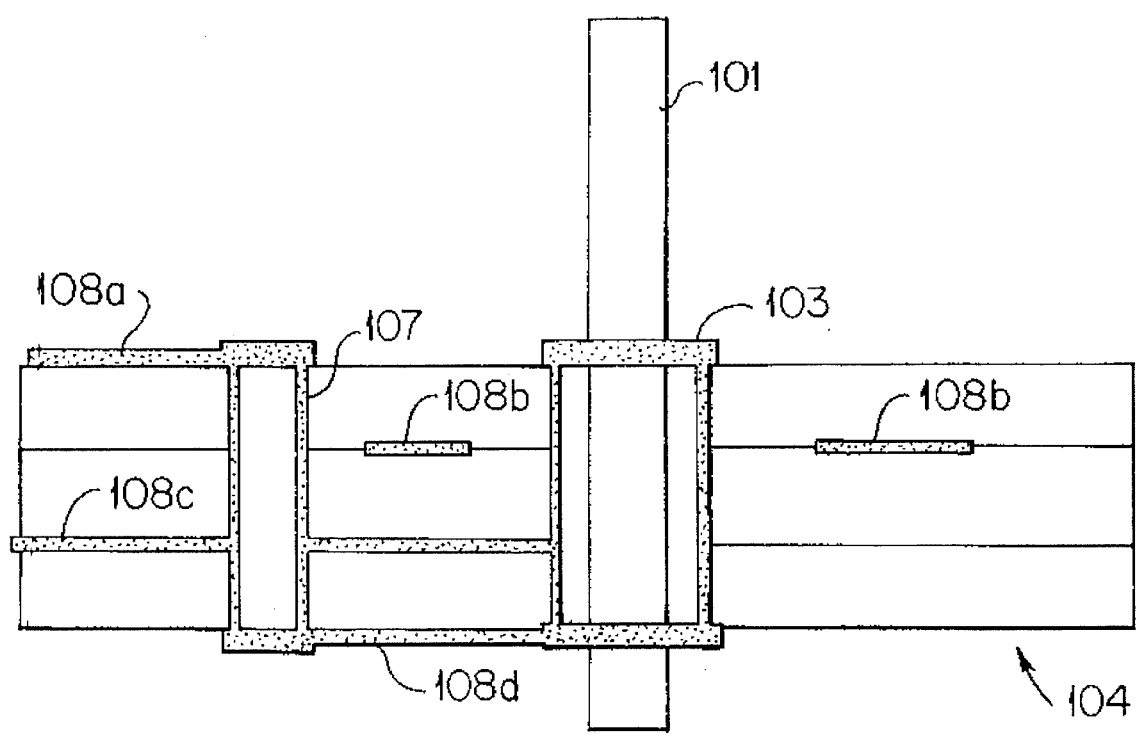
FIG. 5 is a partial side view of a conventional multi-layer PCB using PTH and via technology.
Figure 7:
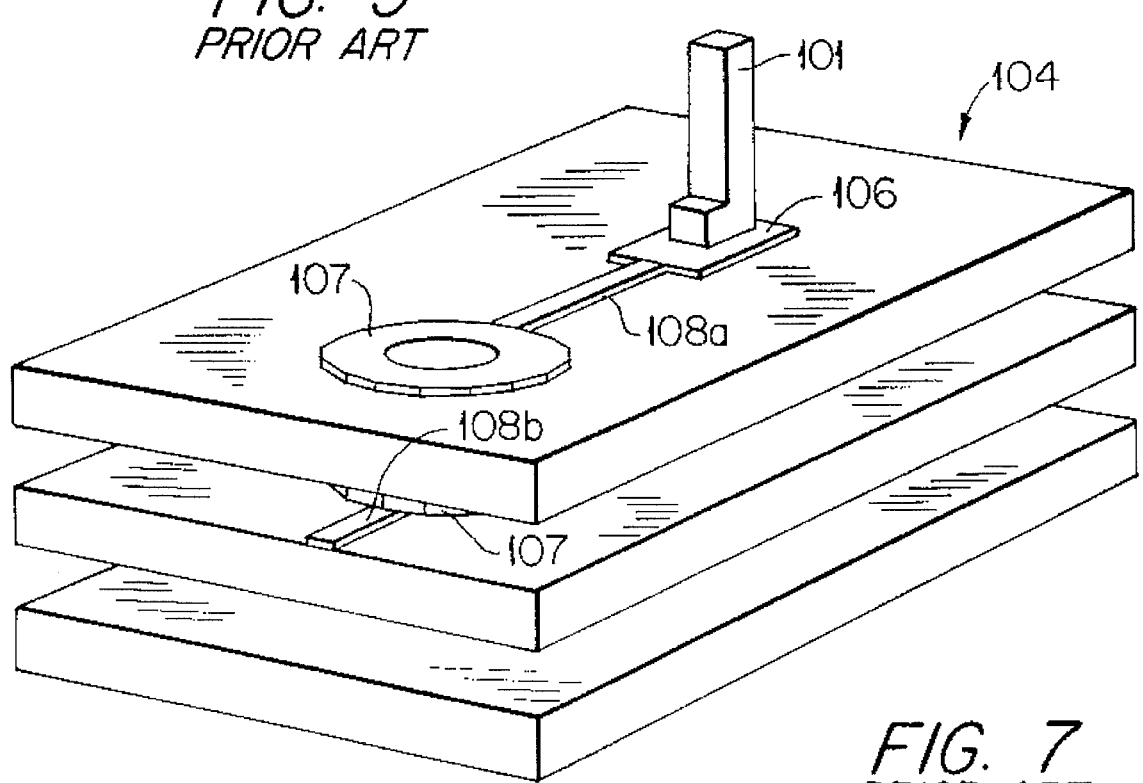
FIG. 7 is a partial perspective view of a conventional multi-layer PCB using SMT and via technology.
Figure 6:
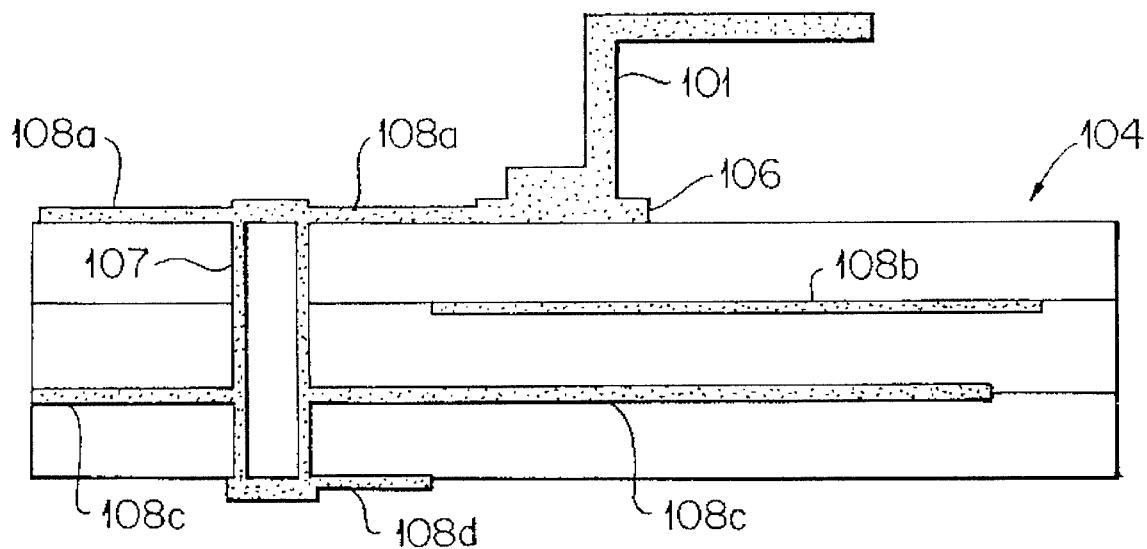
FIG. 6 is a partial side view of a conventional multi-layer PCB using SMT and via technology.

The present invention contemplates a multi-layer substrate, such as a PCB, a multi-layer ceramic, or flat flexible cable (FFC), providing direct access to the inner layers of the multi-layer substrate using one or more wires or component leads or legs. By directly accessing traces or the like on the inner layers of the multi-layer substrate using wires or component leads or legs, currently-required traces, clearances, and vias can be eliminated, thereby increasing the contact density of the multi-layer substrate to take advantage of the increased density of present and contemplated semiconductor and other electronic packages.

The present invention is applicable, for example, to all multi-layer substrates formed using a lamination procedure. For example, the present invention is applicable to all multi-layer substrates having insulative and conductive layers, including PCBs having insulative layers made of FR4 or the like. Direct access to the inner layers of the multi-layer substrate may be achieved by using the leads or legs of a component, such as a semiconductor chip, for example, and/or by using a wire from any origin, including a wire that has been wire-bonded to a chip or a wire that otherwise comes off a chip or a bonding wire for a chip on a board. Any lead, wire, or similar conductive structure is applicable for use in providing direct access to the inner layers of a multi-layer substrate in accordance with the present invention.

The present invention obtains direct access to the inner layers of the multi-layer substrate by providing wells, either plated or unplated, into which the wires or leads of an electrical or electronic component can be inserted to achieve contact at the bottom of the well with an SMT-compatible bonding pad or like circuit component running along the layer at the bottom of the well and, if the well is plated, to achieve contact at the sides of the well with one or more circuit components running along the layer or layers at the sides of the well. In conventional PCB technology, connections are made using PTH components, which are more difficult to mount than SMT components, and PTHs passing all the way through the PCB, so that fulfillment of a contact at any one layer uses board space on all of the other layers. This complicates circuit design while only providing limited related benefits. In the present invention, on the other hand, the layers of the PCB or other multi-layer substrate are separately drilled. When the layers of the multi-layer substrate are then assembled, wells are created in the multi-layer substrate, with each well bottoming at a predetermined level where the point of contact is desired, thereby eliminating the need for vias and related traces. In this manner, layers below the bottom of the well are undisturbed and circuits can be routed in lower layers without being affected by the higher level contact.

Details relating to the present invention will now be discussed with reference to the accompanying drawings. For the sake of convenience, the same reference numerals will be used to designate the same or similar components of the present invention in the accompanying drawings.

Figure 8:
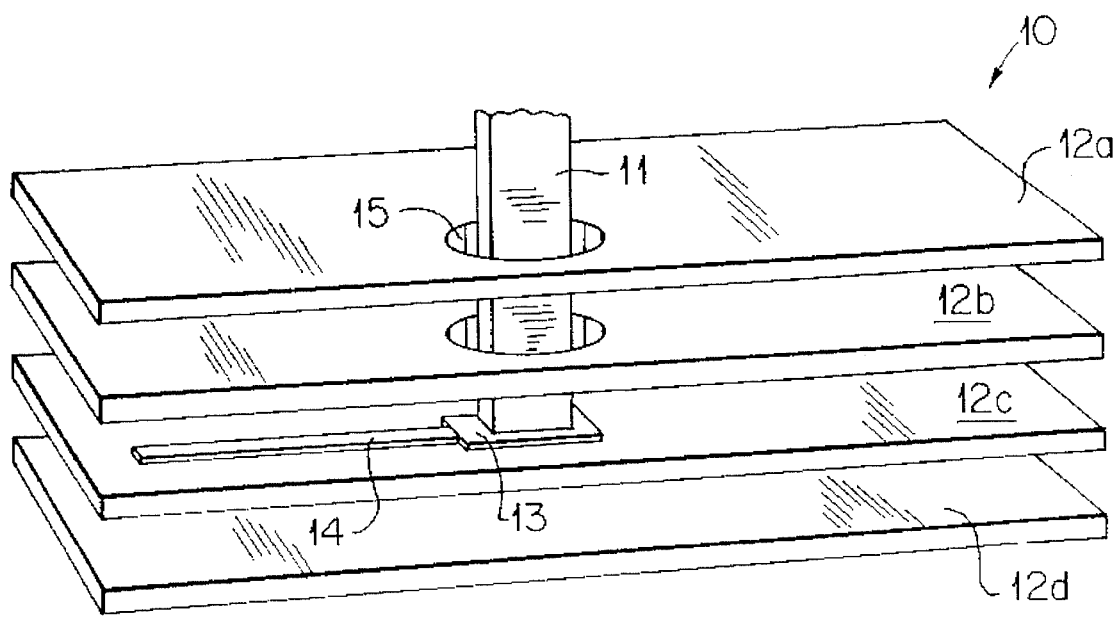
FIG. 8 is a partial perspective view showing a well and a lead or wire that is SMT-mounted to an inner layer of a multi-layer substrate configured in accordance with the present invention with the layers separated for ease of explanation.

FIG. 8 is a partial perspective view of a multi-layer substrate 10 in accordance with the present invention, with the individual layers of the substrate shown separated for ease of explanation. The substrate 10 may be a PCB or other multi-layer substrate, for example. A conductive structure 11, which may be a wire or a lead from an electrical or electronic component (not shown) such as a semiconductor package, is fastened to the substrate 10. The substrate 10 includes an upper insulative layer 12a, inner insulative layers 12b and 12c, and a lower insulative layer 12d. In FIG. 8, the lowermost one of the inner layers 12c has an SMT-compatible conductive bonding pad 13 formed or fabricated thereon, as well as a conductive trace 14 connecting to the bonding pad. A hole is disposed in the upper layer 12a and the uppermost one of the inner layers 12b to form a well 15 extending from the upper surface 12a all the way to the lowermost one of the inner layers 12c. The conductive structure 11 extends into the well 15 and is soldered to the bonding pad 13 to form a solder joint (not shown in FIG. 8) fastening the conductive structure 11 to the lowermost inner layer 12c. The solder joint holds the lead 11 in direct contact with the bonding pad 13.

It should be noted that while the multi-layer substrate 10 of FIG. 8 is shown having four insulative layers, in accordance with the present invention, a multi-layer substrate may have any number of insulative layers, such as less than four or more than four. It should also be noted that while the substrate 10 of FIG. 8 is shown having a well 15 formed through the upper layer 12a of the substrate, wells in accordance with the present invention may be formed through the lower layer 12d of the substrate to allow the insertion of leads, wires, and like conductive structures from below the substrate.

FIG. 8 illustrates that in accordance with the present invention, only the layers that lie between the surface of the substrate 10 and the inner layer 12c selected as the destination of the electrical signal have a well 15 formed therethrough. Consequently, each layer (for example, lower layer 12d) below the bottom of the well 15 is undisturbed and circuits can be routed on that layer without being affected by the well that has been formed above it.

Figure 9:
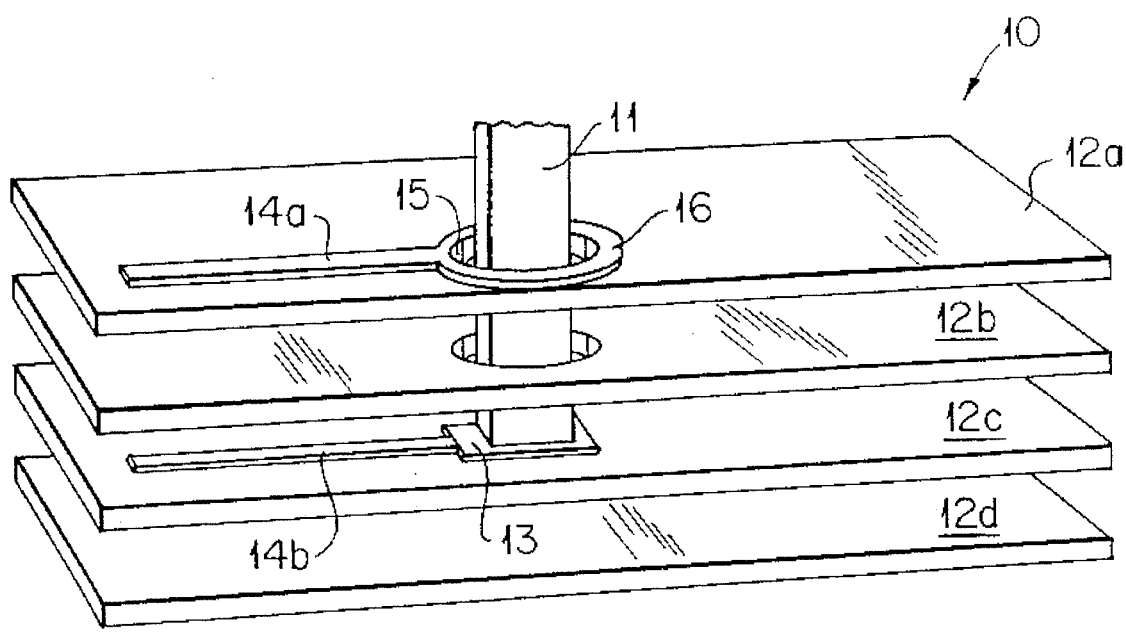
FIG. 9 is a partial perspective view showing a well with an annular ring and a lead or wire that is SMT-mounted to an inner layer of a multi-layer substrate configured in accordance with the present invention with the layers separated for ease of explanation.

FIG. 9 is a partial perspective view of a multi-layer substrate 10 in accordance with the present invention, with the individual layers of the substrate separated for ease of explanation. As seen from FIG. 9, an annular ring 16 may be formed around the well 15 on the upper surface of layer 12a of the substrate, although use of an annular ring is optional. The annular ring 16, formed of electrically conductive material, connects to a trace 14a also formed on the upper surface of insulative layer 12a of the substrate. The conductive structure 11 passes through the annular ring 16 and contacts a bonding pad formed on inner layer 12c, which bonding pad connects to a trace 14b formed on that inner layer. The soldering of the conductive structure 11 to the multi-layer substrate 10 will be discussed below with reference to FIG. 10.

Figure 10:
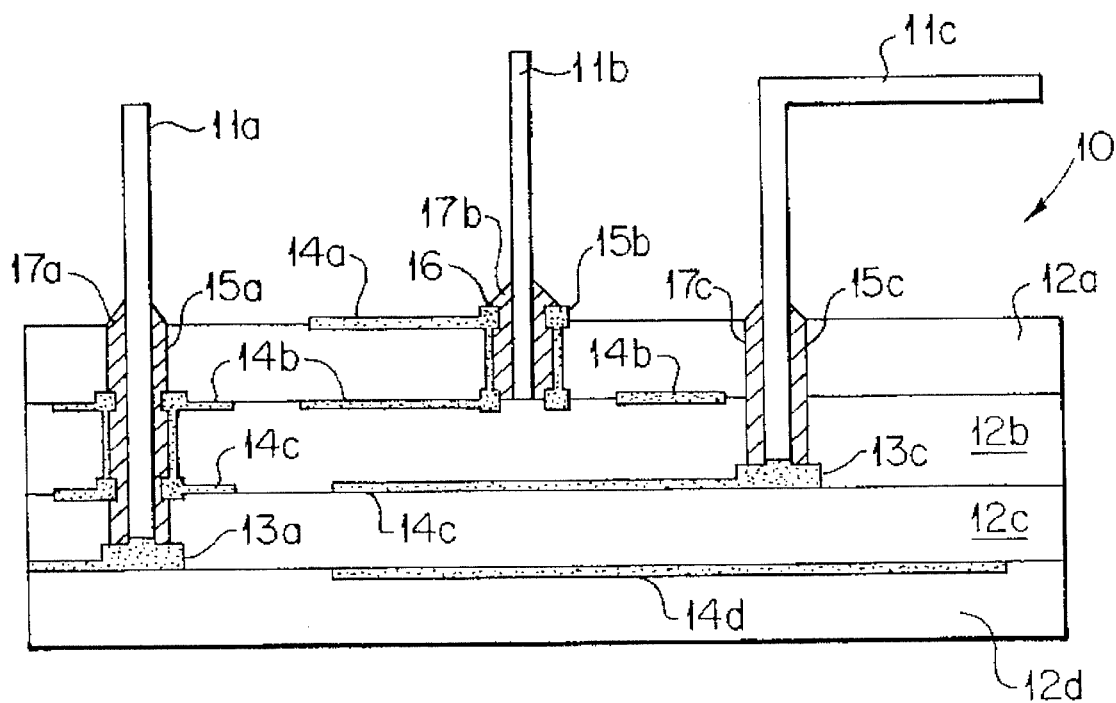
FIG. 10 is a partial side view of a multi-layer substrate configured in accordance with the present invention showing the soldering of leads and/or wires to an annular ring, to conductive plating, and to bonding pads.

FIG. 10 illustrates different ways in which a conductive structure such as a wire or component lead can be fastened or soldered within a well in accordance with the present invention. In FIG. 10, three conductive structures 11a, 11b, and 11c are shown. The conductive structure 11a may be a straight lead or wire, the conductive structure 11b may be a straight lead or wire, and the conductive structure 11c may be a bent lead or wire. Each of the conductive structures 11a, 11b, and 11c is fastened within a corresponding well 15a, 15b, and 15c, respectively. The well 15a includes a plated portion interposed between unplated portions. The well 15a may be formed in the same manner that a blind via having unplated passages above and below it could be formed and, therefore, eliminates the cost that would be required to plate the upper and lower portions. The well 15b is similar to the well depicted in FIG. 9 in that an annular ring 16 is formed around the well on the upper surface of layer 12a of the multi-layer substrate, although unlike the well in FIG. 9, the well 15b is plated along its length and does not have a bonding pad located at the bottom of the well. The well 15c is similar to the well depicted in FIG. 8 in that it does not have an annular ring associated therewith.

A lead or wire 11a may be secured within a well 15a having plated and unplated portions as follows. After the holes of the well 15a are formed in the various insulative layers, and the layers are laminated together, the lead or wire 11a is inserted into the well and makes direct physical contact with the bonding pad 13a located at the bottom of the well. The lead or wire 11a is soldered to the plated portion of the well 15a and also to the bonding pad 13a to form a conductive solder joint 17a fastening the lead or wire to the plated portion of the well and the bonding pad. Such soldering serves to hold the lead or wire 11a in direct physical contact with the bonding pad 13a.

A lead or wire 11b may be secured within a plated well 15b associated with an annular ring 16 as follows. After the holes for the well 15b are formed in the various insulative layers, and the layers are laminated together, the lead or wire 11b is inserted into the well and soldered to the annular ring 16 and plating material to form a conductive solder joint 17b fastening the lead or wire to the annular ring and the plating material.

A lead or wire 11c may be fastened within an unplated well 15c as follows. After the holes for the well 15c are formed in the various insulative layers, and the layers are laminated together, the lead or wire 11c is inserted into the well and makes direct physical contact with the bonding pad 13c located at the bottom of the well. Thereafter, the lead or wire 11c is soldered to the bonding pad 13c to form a conductive solder joint 17c fastening the lead or wire to the bonding pad. The solder joint 17c may completely fill the well 15c, as depicted in FIG. 10 or, alternatively, the solder joint may fill only the lower portion of the well 15c.

Figure 11A:
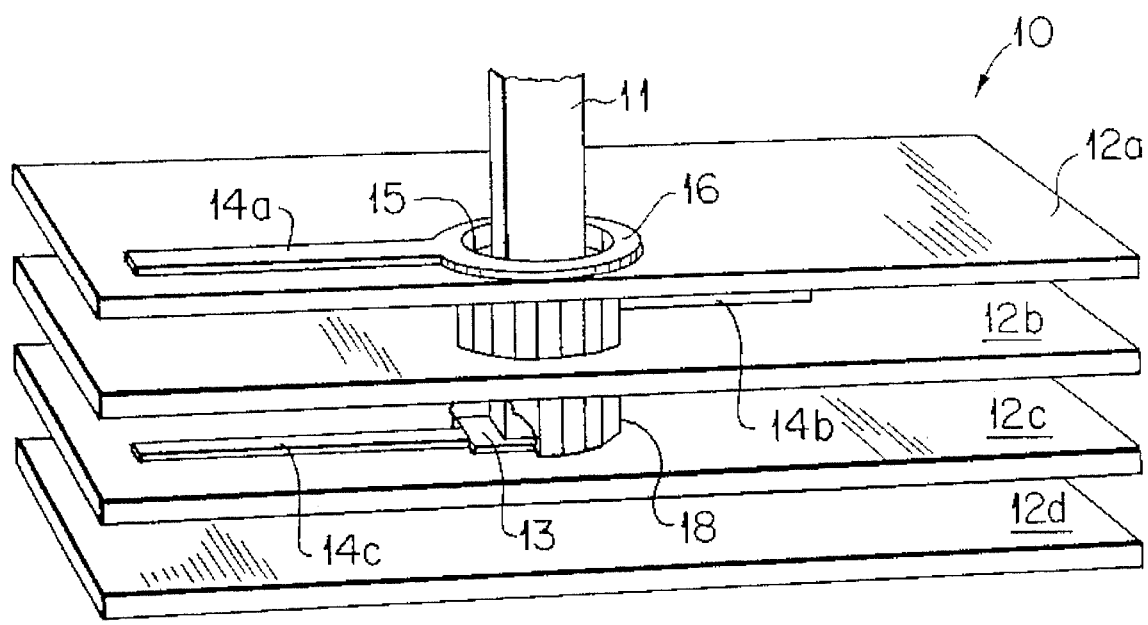
FIG. 11(a) is a partial perspective view showing a plated well and a lead or wire that is SMT-mounted to an inner layer of a multi-layer substrate configured in accordance with the present invention with the layers separated for ease of explanation.

FIG. 11(a) is a partial perspective view of a multi-layer substrate 10 in accordance with the present invention, with the individual layers of the board separated for ease of explanation. In FIG. 11(a), the well 15 is plated with electrically conductive material 18 in the same manner that a PTH might be. Unlike a PTH, however, the plated well of FIG. 11(a) may not extend all the way through the substrate 10. Instead, the plated well may bottom at the inner layer 12c above the lower layer 12d, so that each layer below the well 15 is undisturbed and circuits can be routed on that layer without being affected by the well that has been formed above it. In connection with usage of a plated well, the entire well 15 may be filled with conductive solder material to achieve bonding between the lead or wire 11, the annular ring 16, the bonding pad 13, the electrically conductive material 18, and the inner and outer layer traces 14a, 14b, and 14c. Alternatively, only a portion of the plated well 15 may be filled with conductive solder material to achieve bonding between the lead or wire 11 and selected ones of the aforementioned elements.

Figure 11B:
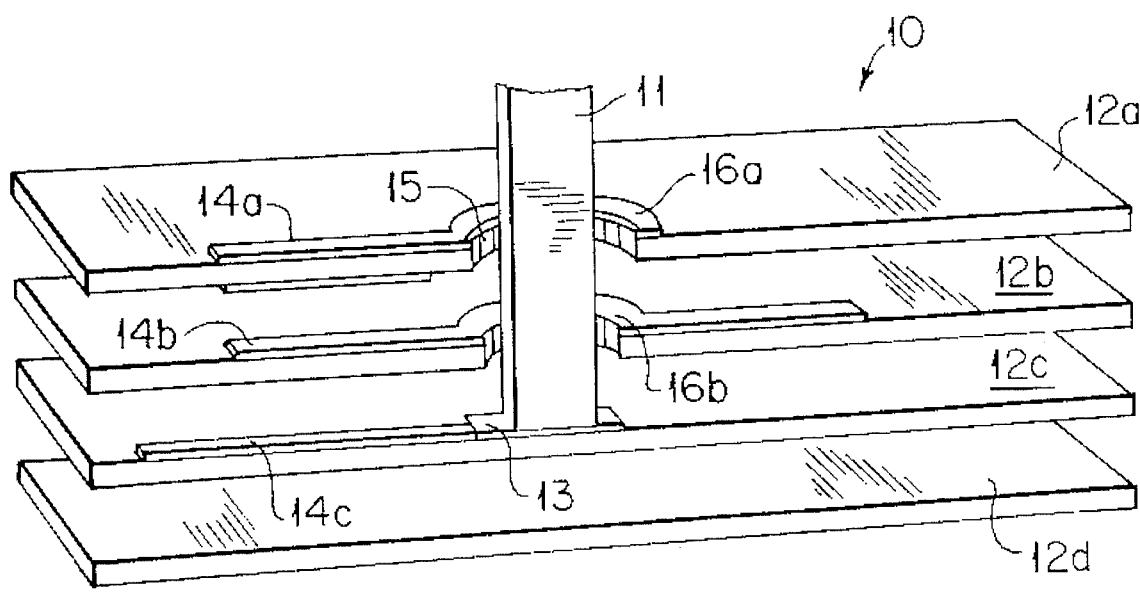
FIG. 11(b) is a partial perspective view showing a well surrounded by external and internal annular rings and a lead or wire that is SMT-mounted to an inner layer of a multi-layer substrate in accordance with the present invention with the layers separated for ease of explanation.

FIG. 11(b) is a partial perspective view of a multi-layer substrate 10 in accordance with the present invention, with the individual layers of the substrate separated for ease of explanation. In FIG. 11(b), the well 15, while unplated, has an annular ring 16a formed around the well on the upper surface of layer 12a and an annular ring 16b formed around the well on the upper surface of layer 12b. While not shown in FIG. 11(b), annular rings 16a and 16b could be formed on the lower surfaces of layers 12a and 12b, respectively, rather than on the upper surfaces of such layers. Each layer through which the well 15 passes may have an annular ring or, alternatively, only selected ones of the layers through which the well passes may have an annular ring. Also, the holes in the annular rings may be of different sizes. For example, the hole in annular ring 16a may be larger than the hole in annular ring 16b, as in FIG. 16(b), or, alternatively, the hole in annular ring 16a may be smaller than the hole in annular ring 16b. In use, the entire well 15 of FIG. 11(b) may be filled with conductive solder material to achieve bonding between the lead or wire 11, the annular rings 16a and 16b, the bonding pad 13, and the inner and outer traces 14a, 14b, and 14c. Alternatively, only a portion of the well 15 of FIG. 11(b) may be filled with conductive solder material to achieve bonding between the lead or wire 11 and selected ones of the aforementioned elements.

Plated wells, such as the well 15 of FIG. 11(a), may be manufactured in accordance with the following methods or, alternatively, in accordance with other manufacturing methods. In general, a plated well may be fabricated between the desired layers using via fabrication technology, with a double-sided clad insulator used as a core, and a conductive bonding pad may be formed on the inner layer surface where electrical contact is desired.

A first method for forming a plated well will be discussed with reference to the illustrations in FIGS. 12(a), 12(b), and 12(c), and the flow chart shown in FIG. 13. In accordance with the first method for forming a plated well, a plurality of flat insulative sheets are first of all selected (step S1 of FIG. 13). These insulative sheets are used to form the upper insulative layer 12a, the inner insulative layer 12b, and the lower insulative layer 12c, of the multi-layer substrate. Preferably, the insulative sheets are formed of FR4, TEFLON (trademark), ceramic, or other insulative material suitable for use in manufacturing the various layers of a multi-layer substrate (for example, an FFC, a multi-layer ceramic conductor, a PCB, or other such substrate).

Figure 12A:
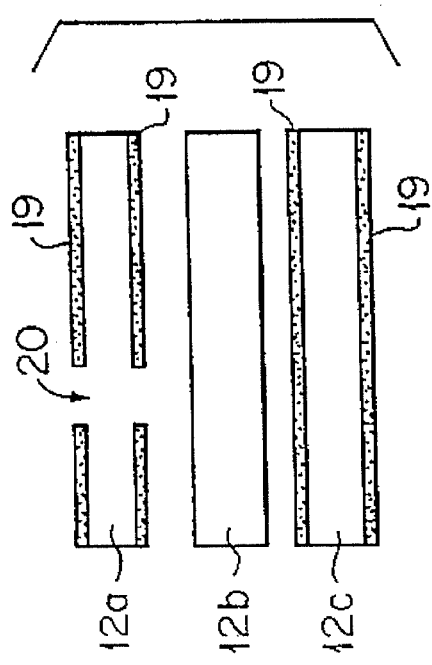
FIG. 12(a) is an example of a first stage in the manufacturing of a multi-layer substrate in accordance with the present invention having a plated well.

As seen from FIG. 12(a), the upper and lower layers 12a and 12c may each be clad with metal material 19 on both sides thereof, while the inner layer 12b may be an unclad, pre-preg layer impregnated with material suitable to achieve lamination. The metal material 19 may be made of copper, silver, or other electrically conductive material. The metal material 19 is used to form conductive components such as the bonding pads and the traces that have been discussed above.

Figure 13:
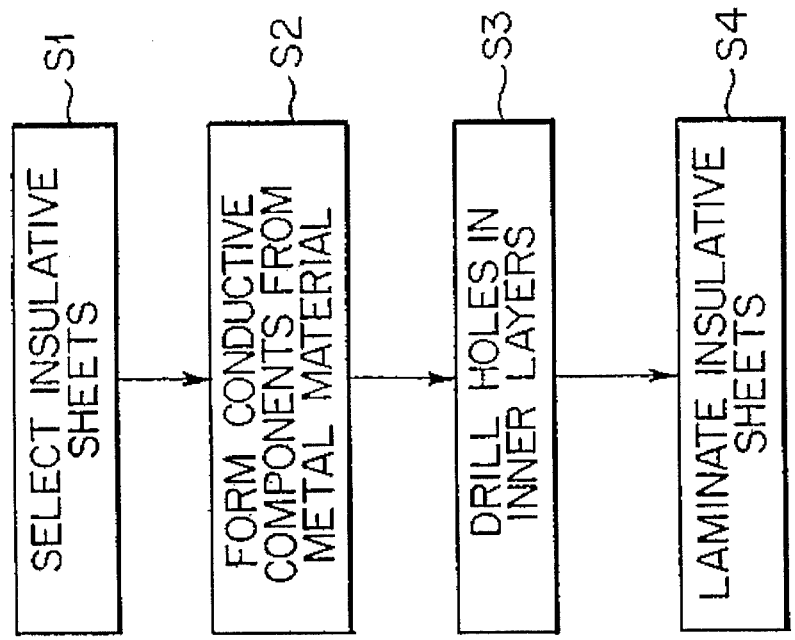
FIG. 13 is a flow chart showing exemplary steps which may be performed to manufacture a multi-layer substrate in accordance with the present invention having a plated well.
Figure 12B:
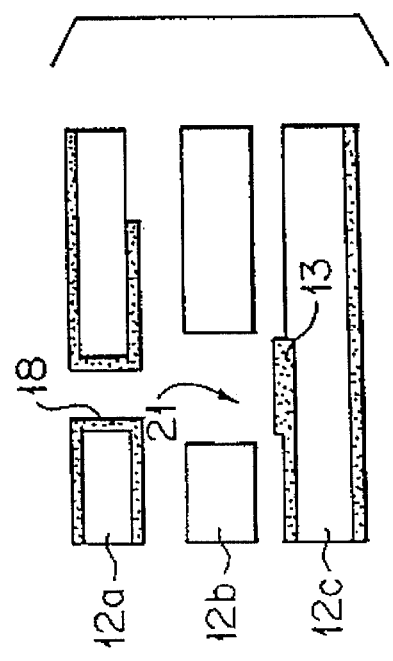
FIG. 12(b) is an example of a second stage in the manufacturing of a multi-layer substrate in accordance with the present invention having a plated well.

In accordance with step S2 of FIG. 13, a hole 20 is drilled in one of the clad layers (the clad layer 12a in FIG. 12(a), for example), the hole is plated with conductive material 18, and etching or the like is carried out to form a bonding pad 13 on another one of the clad layers (the clad layer 12c in FIG. 12(b), for example). In step S3 of FIG. 13, a hole 21 is drilled in the unclad, pre-preg insulative layer 12b that lies between the hole 20 and the inner layer bonding pad 13, as shown in FIG. 12(b). The hole 21 in the pre-preg layer 12b is preferably larger than the plated hole 20 drilled in the clad layer 12a. The diameter of the hole 21 is determined by factors including: viscosity of the pre-preg material during lamination, which is primarily determined by the properties of the epoxy resin compound used for bonding; capillary action of the plated hole 20; and lamination temperature.

As an alternative to using an insulative layer 12b that has had pre-preg material applied thereto throughout the entirety of the layer, the insulative layer could be "selectively prepregged," i.e., one or more portions of the insulative layer 12b (for example, the portions through which holes 21 will be drilled) may not have pre-preg material applied thereto while the remaining portions of the layer may have pre-preg applied thereto. By refraining from applying pre-preg material to the portions of layer 12b through which the holes 21 will be drilled, seepage of pre-preg material into the holes during lamination can be prevented and, consequently, the hole 20 drilled in layer 12a and the corresponding hole 21 drilled in layer 12b may be configured to be the same size.

As an alternative to using an insulative layer 12b having any pre-preg material applied thereto, the insulative layer 12b may comprise TEFLON (trademark) or some other insulator having dry sheet adhesive (a material functioning like double-sided tape) formed on its upper and lower surfaces. Dry sheet adhesive avoids the need for heating during lamination and also avoids pre-preg material seepage so that each hole 20 in layer 12a and its corresponding hole 21 in layer 12b may have the same size.

It should be noted that the holes for each well are always drilled on the upper (or lower) layer of the multi-layer substrate. For each well, only the layers that lie between the surface of the multi-layer substrate and the inner layer selected as a destination for the signal are drilled.

Figure 12C:
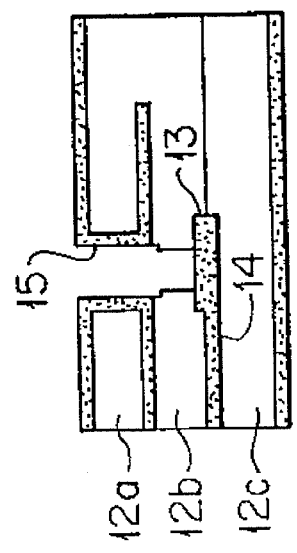
FIG. 12(c) is an example of a third stage in the manufacturing of a multi-layer substrate in accordance with the present invention having a plated well.

After drilling of the holes and formation of bonding pads, traces, and other like conductive components, the insulator sheets are laminated together in step S4 of FIG. 13 to form a multi-layer substrate in accordance with the present invention, as shown in FIG. 12(c). During the lamination process, when a layer 12b having pre-preg material applied thereto is used, high temperature is applied to the stacked layers including the pre-preg layer 12b. There is a predictable amount of flow of the pre-preg material into the well area (unless the layer 12b is selectively pre-pregged), but this flow does not cover the inner layer bonding pad 13. The resulting plated well 15 is shown in FIG. 12(c).

Figure 14A:
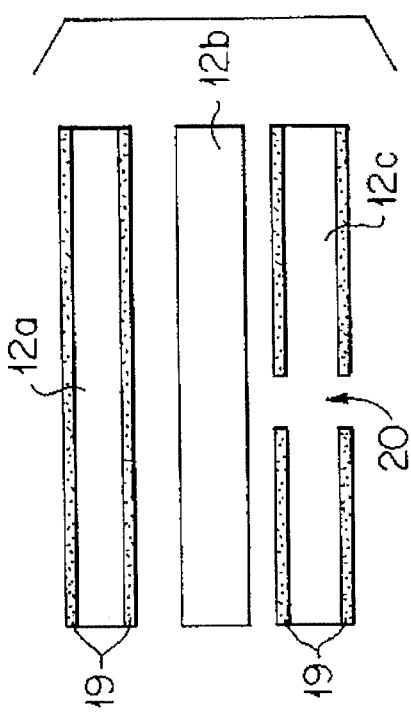
FIG. 14(a) is an example of a first stage in the manufacturing of a multi-layer substrate in accordance with the present invention having a plated well.

A second method of forming a plated well will be discussed with reference to the illustrations in FIGS. 14(a), 14(b), and 14(c), and the flow chart in FIG. 15. Steps S1 and S2 of this method are the same, respectively, as the steps S1 and S2 for the first method of forming a plated well that was discussed above. In other words, step S1 of FIG. 15 involves selecting a plurality of insulative sheets, as shown in FIG. 14(a), and step S2 of FIG. 15 involves drilling a hole 20 into one of the clad layers (the clad layer 12c of FIG. 14(a), for example), plating the hole with a conductive material 18, and carrying out etching or the like to form a bonding pad 13 on another one of the clad layers (the clad layer 12a in FIG. 14(b), for example).

Figure 15:
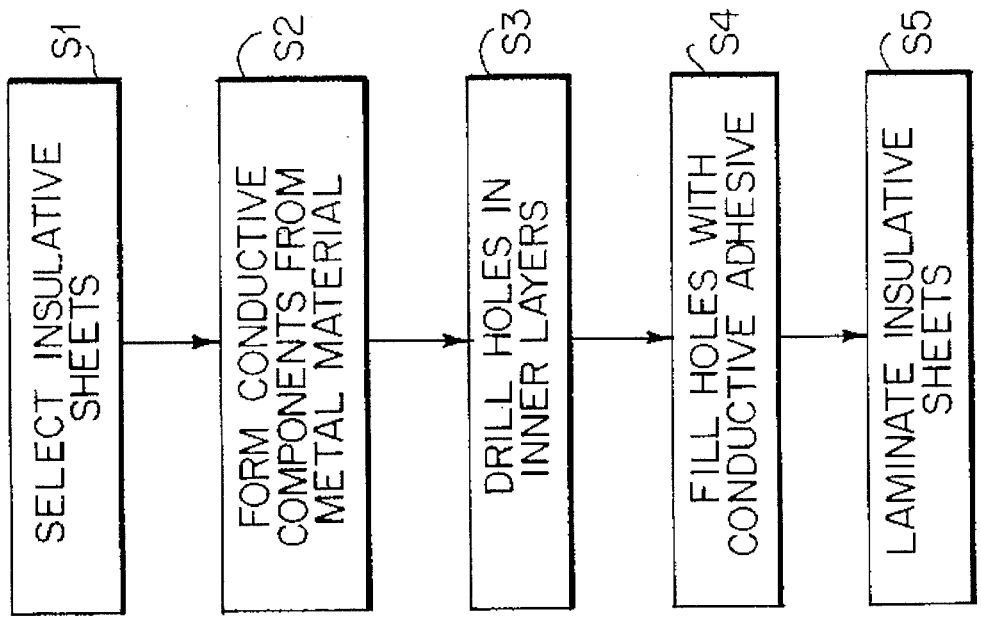
FIG. 15 is a flow chart showing exemplary steps which may be performed to manufacture a multi-layer substrate in accordance with the present invention having a plated well.
Figure 14B:
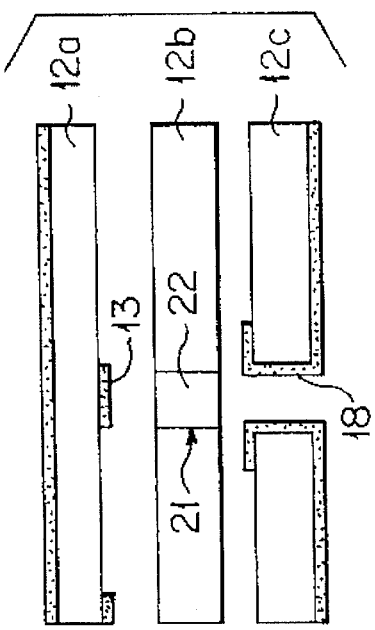
FIG. 14(b) is an example of a second stage in the manufacturing of a multi-layer substrate in accordance with the present invention having a plated well.

In step S3 of FIG. 15, a hole 21 is drilled in the unclad, pre-preg insulative layer 12b that lies between the hole 20 and the inner layer bonding pad 13, as shown in FIG. 14(b). The hole 21 in the pre-preg layer 12b for the second plated well method, unlike the hole 21 for the first plated well method when the layer 12b has pre-preg material applied thereto throughout its entirety, is preferably the same size as the plated hole 20 drilled in the clad layer 12c.

Step S4 of FIG. 15 comprises plugging or filling the hole 21 (by screening, for example) with an electrically conductive adhesive 22, as shown in FIG. 14(b). The electrically conductive adhesive 22 has limited flow during lamination, yet binds the various layers together well.

Figure 14C:
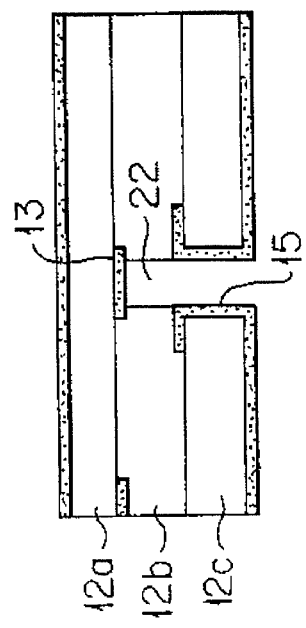
FIG. 14(c) is an example of a third stage in the manufacturing of a multi-layer substrate in accordance with the present invention having a plated well.

The insulative sheets are laminated together in step S5 of FIG. 15 to form a multi-layer substrate in accordance with the present invention, as shown in FIG. 14(c). During lamination, the conductive adhesive performs two functions: it keeps the pre-preg material from flowing into the well and also secures electrical conductivity between the plated well 15 and the inner layer bonding pad 13. The finished plated well 15 is shown in FIG. 14 (c).

As with the first plated well method, rather than being pre-pregged throughout its entirety, the layer 12b in the second plated well method may be selectively pre-pregged or may utilize dry sheet adhesive.

Unplated wells, such as the well 15 of FIG. 8, may be manufactured in accordance with the following methods or, alternatively, in accordance with other manufacturing methods. In general, for unplated wells, each insulative layer corresponding to where the well is to be formed is drilled separately, and a bonding pad is formed on the inner layer where electrical contact is desired.

A first method for forming an unplated well will be discussed with reference to the illustrations in FIGS. 16(a), 16(b), and 16(c), and the flow chart shown in FIG. 17. In accordance with the first method for forming an unplated well, a plurality of flat insulative sheets are first of all selected (step S1 of FIG. 17). These insulative sheets are used to form the upper insulative layer 12a, the inner insulative layers 12b, 12c, and 12d, and the lower insulative layer 12e.

Figure 16A:
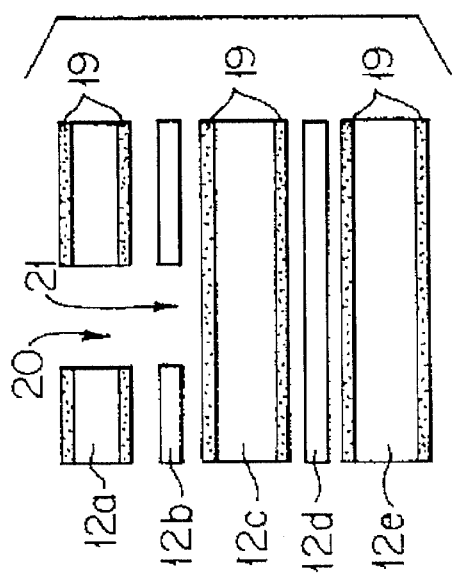
FIG. 16(a) is an example of a first stage in the manufacturing of a multi-layer substrate in accordance with the present invention having an unplated well.

As shown in FIG. 16(a), the insulative layers 12a, 12c, and 12e may each be clad with metal material 19 on both sides thereof, while layers 12b and 12d may be unclad, pre-preg layers impregnated with material suitable to achieve lamination, selectively pre-pregged layers, or insulative layers having dry sheet adhesive applied thereto. The material 19 is used to form conductive components such as the annular rings, the bonding pads, and the traces that have been discussed above.

Figure 17:
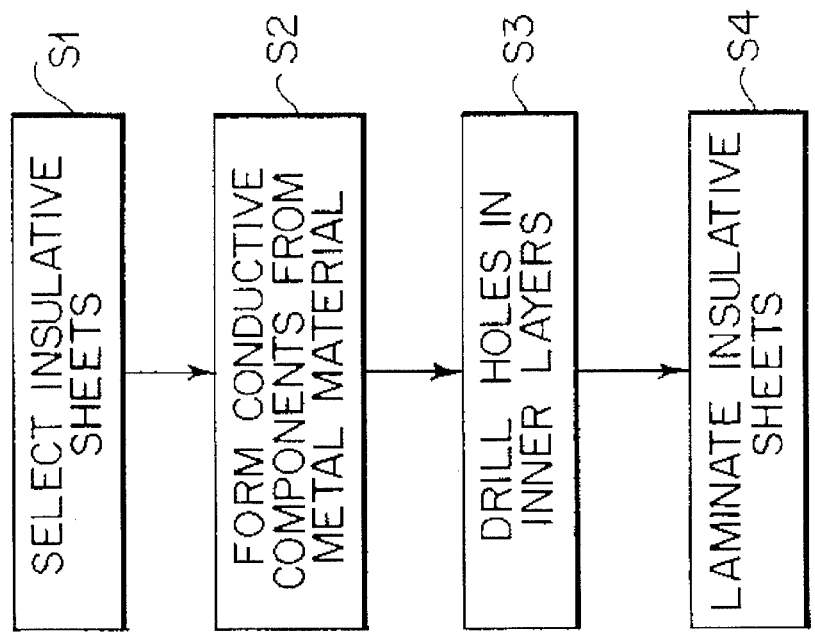
FIG. 17 is a flow chart showing exemplary steps which may be performed to manufacture a multi-layer substrate in accordance with the present invention having an unplated well.
Figure 16B:
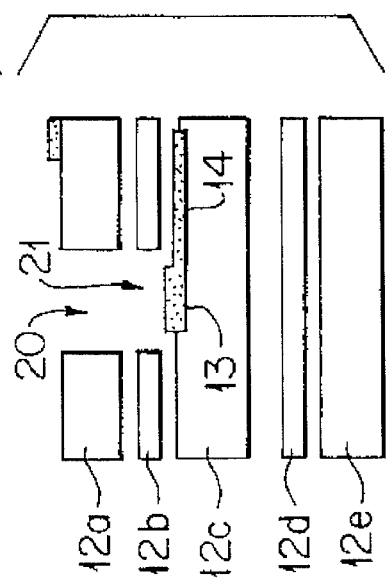
FIG. 16(b) is an example of a second stage in the manufacturing of a multi-layer substrate in accordance with the present invention having an unplated well.

In accordance with step S2 of FIG. 17, a hole 20 is drilled in one of the clad layers (the clad layer 12a in FIG. 16(a), for example), and etching or the like is carried out to form a bonding pad 13 and one or more traces 14 on one or more of the other clad layers (the clad layer 12c in FIG. 16(b), for example). In step S3 of FIG. 17, a hole 21 is drilled in the unclad, insulative layer 12b that lies between the hole 20 and the inner layer pad 13, as shown in FIG. 16(b). The hole 21 in the insulative layer 12b is preferably larger than the hole 20 drilled in the clad layer 12a, or these holes may be the same size when the insulative layer 12b is selectively pre-pregged or has dry sheet adhesive applied thereto. The diameter of the hole 21 is determined by the following principle factors: viscosity of the pre-preg material during lamination, which is primarily determined by the properties of the epoxy resin compound used for bonding; capillary action of the hole 20; and lamination temperature.

As is the case for plated wells, the holes for each unplated well are drilled in the upper (or lower) layer of the multi-layer substrate. For each well, only the layers that lie between the surface of the multi-layer substrate and the inner layer selected as a destination for signals are drilled.

Figure 16C:
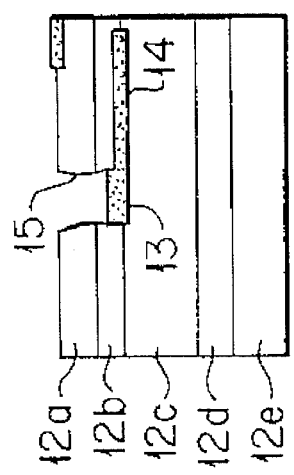
FIG. 16(c) is an example of a third stage in the manufacturing of a multi-layer substrate in accordance with the present invention having an unplated well.

After drilling of the holes and formation of bonding pads, traces, and like conductive components, the insulative sheets are laminated together in step S4 of FIG. 17 to form a multi-layer substrate in accordance with the present invention, as shown in FIG. 16(c). During the lamination process, when layers 12b and 12d having pre-preg material applied thereto are used, high temperature is applied to the stacked layers including the pre-preg layers 12b and 12d. There is a predictable amount of flow of the pre-preg material into the well area (unless the insulative layer 12b is selectively pre-pregged), but this does not cover the inner bonding pad 13. The resulting unplated well 15 is shown in FIG. 16(c).

A second method for forming an unplated well will be discussed with reference to the illustrations in FIGS. 18(a), 18(b), and 18(c), and the flow chart in FIG. 19. The steps S1 and S2 for the second method of forming an unplated well are the same, respectively, as the steps S1 and S2 for the first method of forming an unplated well as discussed above. In other words, the step S1 of FIG. 19 involves selecting a plurality of insulative sheets, as shown in FIG. 18(a), and step S2 of FIG. 19 involves drilling a hole 20 into one of the clad layers (the clad layer 12e of FIG. 18(a), for example), and carrying out etching or the like to form a bonding pad 13 and one or more traces 14 on one or more of the other clad layers (the clad layer 12c in FIG. 18(b), for example).

In step S3 of FIG. 19, a hole 21 is drilled in the unclad, pre-preg insulative layer that lies between the hole 20 and the inner layer pad 13, as shown in FIG. 18(b). The hole 21 in the pre-preg layer 12d for the second unplated well method, unlike the hole 21 for first unplated well method when the layer 12b has pre-preg material applied thereto throughout its entirety, is preferably the same size as the hole 20 drilled in the clad layer 12e.

Step S4 of FIG. 19 comprises plugging or filling the hole 21 (by screening, for example) with an electrically conductive adhesive 22, as shown in FIG. 18(b). The electrically conductive adhesive 22 has limited flow during lamination, yet binds the various layers together well.

The insulative sheets are laminated in step S5 of FIG. 19 to form a multi-layer substrate in accordance with the present invention, as shown in FIG. 18(c). During lamination, the conductive adhesive 22 performs two functions: it keeps the pre-preg material from flowing into the well and also secures electrical conductivity between the inner bonding pad 13 and, after component assembly, the lead inserted into the well.

As with the first unplated well method, rather than being pre-pregged throughout its entirety, the layer having the hole 21 formed therein in the second unplated well method may be selectively pre-pregged or may utilize dry sheet adhesive.

It should be noted that for an unplated well 15 with an annular ring 16, as shown in FIG. 9, for example, the assembly methods are the same as the unplated well methods discussed above, except that the annular ring is etched or otherwise formed around the well on the upper (or lower) layer during the step of forming the conductive components from the metal layer 19.

FIG. 20 is a partial perspective view of a multi-layer substrate 10 in accordance with the present invention with the layers 12a, 12b, 12c, and 12d of the multi-layer substrate shown separated for ease of explanation. FIG. 20 illustrates that the hole 21 in the pre-preg inner insulative layer 12b may be larger than the area of the inner layer bonding pad 13 to allow insulation to flow during lamination but not to an extent that it would fill the well and cover the bonding pad.

FIG. 21 is a partial perspective view of a multi-layer substrate 10 in accordance with the present invention after lamination. FIG. 21 illustrates that although pre-preg material flows somewhat during the lamination step, it does not cover the inner layer bonding pad 13. The conductive plating 18 of the well 15 of FIG. 21 is shown connecting to traces 14a, 14b, and 14c at various levels of the multi-layer substrate 10.

It should be noted that in all the manufacturing methods of the present invention, rather than performing lamination and then soldering, lamination and soldering can be performed simultaneously. For example, the various layers may be positioned adjacent one another, a conductive structure such as a lead or wire may be positioned in each of the wells, and pressurization and heating can be carried out at the same time to simultaneously laminate the layers of the multi-layer substrate and solder each conductive structure within its respective well.

A multi-layer substrate in accordance with the present invention may be a PCB, FFC, multi-layer ceramic conductor, a multi-layer substrate within a semiconductor package, or some other multi-layer substrate, for example. When manufacture of the multi-layer substrate in accordance with the present invention is complete, wires or leaded components may be mounted to the multi-layer substrate by inserting the wires or leads of the components into the wells of the conductor, and then soldering each wire or lead to its corresponding well at an annular ring, bonding pad, and/or conductive plating for that well. It should be noted that each multi-layer substrate in accordance with the present invention may be designed around previously-designed wiring configurations or leaded components or, alternatively, each wiring configuration or leaded component in accordance with the present invention may be designed around a previously-designed multi-layer substrate. In either case, the resulting multi-layer substrates, configurations, and components have characteristics and provide advantages not currently available from conventional multi-layer substrates and PCBs.

The methods and flow charts discussed above are exemplary of the manner in which a multi-layer substrate in accordance with the present invention may be manufactured and mated with corresponding wires or electrical and/or electronic components. Other methods for achieving such ends are envisioned. For example, prior to lamination, the formation of holes, annular rings, bonding pads, traces, PTHs, plated wells, and the like, could be performed in any possible order according to the desired needs of the designer and/or manufacturer. Therefore, as an example, rather than drilling holes in the insulative sheets or layers prior to performing etching, in accordance with the present invention, etching could be performed prior to such drilling.

Figure 22:
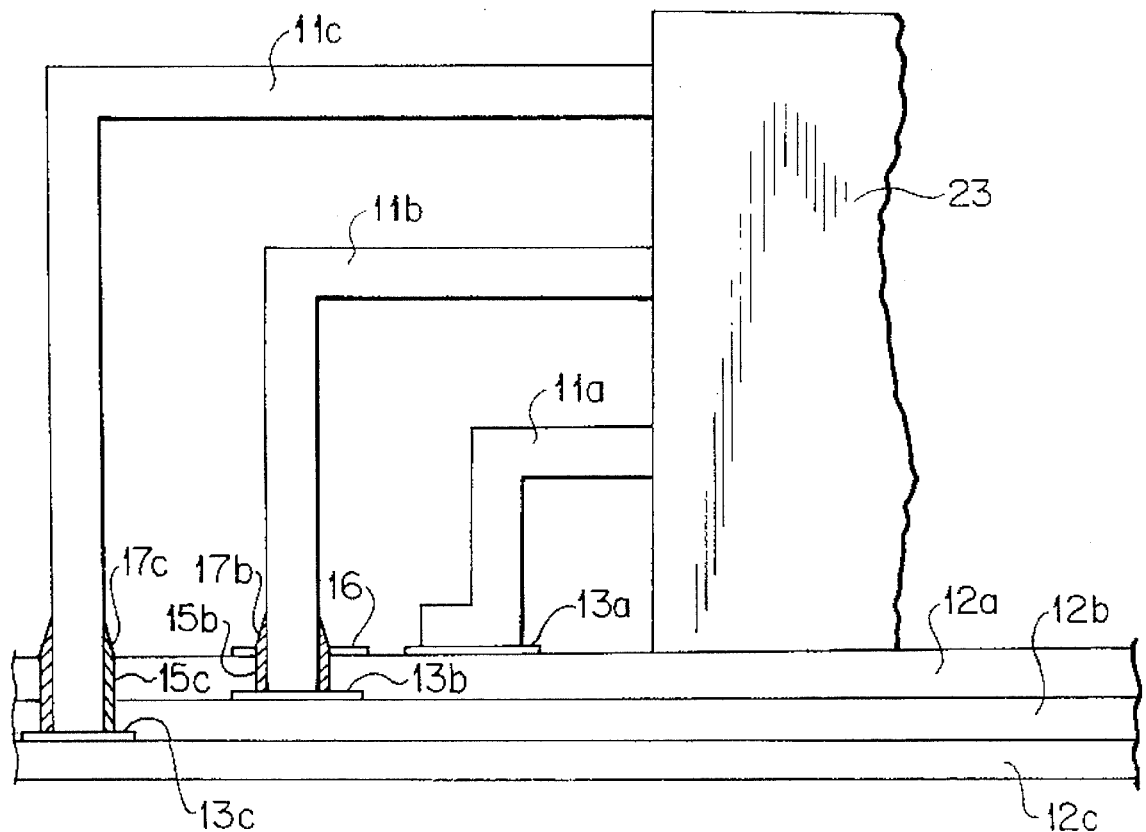
FIG. 22 is a partial side view showing wells and leads of different lengths that are SMT-mounted to various layers of a multi-layer substrate configured in accordance with the present invention.

In accordance with the discussion above, the wires or leads for mounting to a multi-layer substrate in accordance with the present invention may be leads from a semiconductor device or a semiconductor package, leads from resistors, capacitors, inductors, connectors, or other electrical or electronic components, or wires that have been connected to such devices. As can be seen from FIG. 22, each individual leaded component, such as a semiconductor package 23, may have leads of different lengths for SMT-mounting connection to different layers of a multi-layer substrate. The leads of different lengths may extend out from the side or sides of the semiconductor package 23, as shown in FIG. 22, or such leads may extend down from the bottom surface of the package in the manner of a PGA-type package. Moreover, for each individual component, some of the leads may be mounted within wells, while some of the leads may be mounted as SMT leads on the upper surface of the substrate.

The leaded component 23 of FIG. 22 includes leads 11a, 11b, and 11c extending from the side of the component. Lead 11a has a bent foot portion that is soldered to a bonding pad 13a formed on the upper layer 12a of the multi-layer substrate using the SMT method. Lead 11b has a straight foot portion, inserted within a well 15b, which is soldered to a bonding pad 13b formed on an inner layer 12b of the multi-layer substrate using the SMT method and which is also soldered to an annular ring 16 formed on the upper layer 12a. Solder joint 17b retains lead 11b within well 15b and provides conductive interfacing between lead 11b, annular ring 16, and bonding pad 13b. Lead 11c has a straight portion, inserted with a well 15c, which is soldered to a bonding pad 13c formed on a lower layer 12c of the multi-layer substrate using the SMT method. Solder joint 17c retains the lead 11c within the well 15c and provides conductive contact between lead 11c and bonding pad 13c. Conductive traces (not shown in FIG. 22) may connect to annular ring 16 and bonding pads 13a, 13b, and 13c to allow the transmission of signals between the conductive components of the substrate.

Reference is made at this time to corresponding U.S. patent applications to Stanford W. Crane, Jr., et al., filed on even date herewith, entitled "PREFABRICATED SEMICONDUCTOR CHIP CARRIER" and "SEMICONDUCTOR CHIP CARRIER AFFORDING A HIGH-DENSITY EXTERNAL INTERFACE," respectively, each expressly incorporated herein by reference. The semiconductor die carriers disclosed in those copending applications, when configured to have leads with SMT-compatible foot portions that are not coplanar, are suitable for mounting on multi-layer substrates in accordance with the present invention. In this regard, the semiconductor die carriers disclosed in the aforementioned copending patent applications could be, for example, SMT-mounted to various layers of a multi-layer substrate configured in accordance with the present invention. In other words, SMT-mounting at various levels of a multi-layer substrate is applicable to the semiconductor die carriers disclosed in the aforementioned copending patent applications. The manner in which such semiconductor die carriers may be mounted on a multi-layer substrate in accordance with the present invention can be understood, for example, from the illustration in FIG. 22 and the corresponding description provided above.

The present invention is applicable to any components or devices having one or more leads or wires and all multi-layer substrates (including PCBs, FFCs, multi-layer ceramics, multi-layer substrates used within semiconductor packages, or other such substrates). As an example, the leads for mounting to a multi-layer substrate in accordance with the present invention may be leads from a projection-type electrical interconnect component, a receiving-type electrical interconnect component, a socket for receiving a semiconductor package, or the like. In accordance with the present invention, a projection-type electrical interconnect component is a pluggable component configured for receipt within a corresponding receiving-type electrical interconnect component. Likewise, a receiving-type electrical interconnect component is a pluggable component configured to receive a corresponding projection-type electrical interconnect component. With respect to projection-type and receiving-type electrical interconnect components, electrical interconnection is accomplished by inserting each projection-type electrical interconnect component into a corresponding receiving-type electrical interconnect component. Such insertion brings the conductive portions of the projection-type and receiving-type electrical interconnect components into contact with each other so that electrical signals may be transmitted through the interconnect components.

Figure 23A:
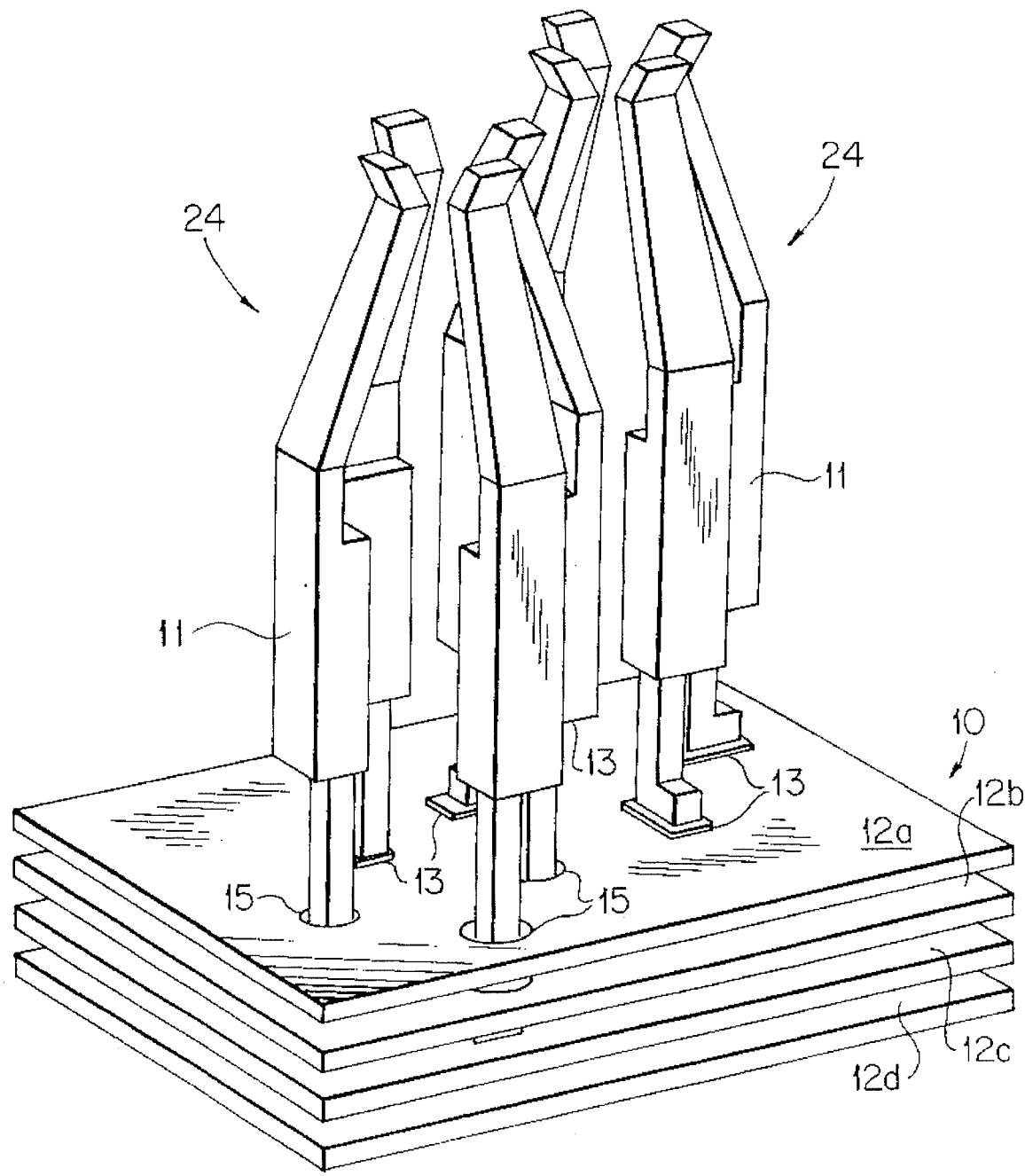
FIG. 23(a) is a partial perspective view of a plurality of receiving-type electrical interconnect components mounted to a multi-layer substrate configured in accordance with the present invention.
Figure 23B:
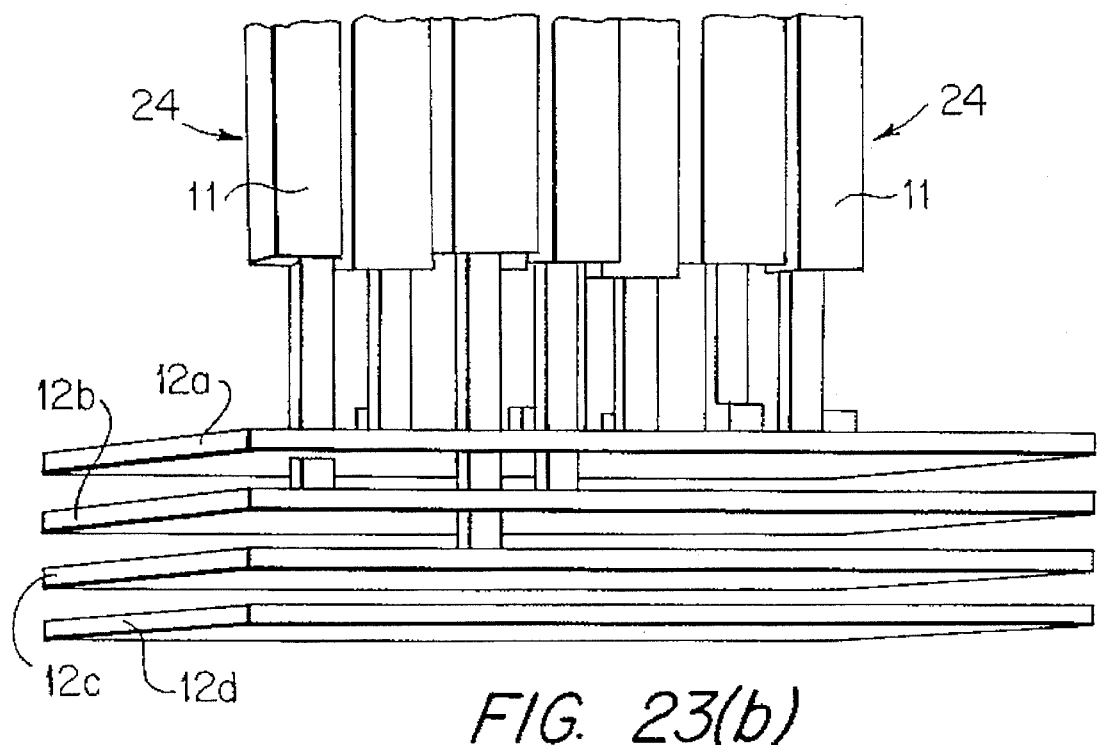
FIG. 23(b) is another partial perspective view of the electrical interconnect components illustrated in FIG. 23(a).
Figure 23C:
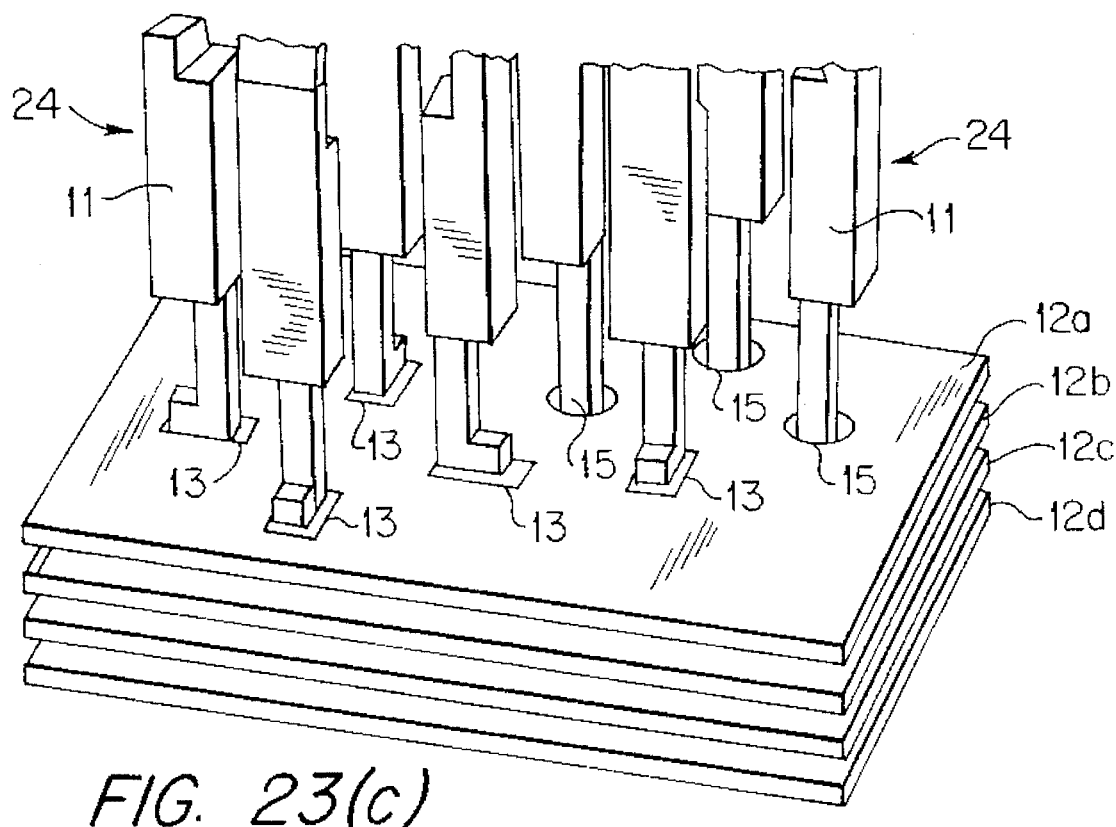
FIG. 23(c) is yet another partial perspective view of the electrical interconnect components illustrated in FIG. 23(a).

FIGS. 23(a), 23(b), and 23(c), collectively referred to herein as "FIG. 23," are different partial perspective views of a multi-layer substrate 10 (a PCB, for example) in accordance with the present invention having a plurality of receiving-type interconnect components 24 mounted thereto. In FIG. 23, the individual layers of the board are separated for ease of explanation. Not shown in FIG. 23 is an insulative substrate within which the individual leads 11 of the receiving-type interconnect components 24 are anchored prior to mounting to the multi-layer substrate 10. The insulative substrate insulates the leads 11 from one another and maintains the positional relationship of the leads 11 with respect to one another. The insulative substrate is positioned above the portions of the leads which contact the substrate 10 and below the angled portions of the leads.

FIG. 23(a) shows two receiving-type electrical interconnect components 24 mounted to the multi-layer substrate 10, each of the receiving-type electrical interconnect components including, for example, four leads 11. In FIG. 23(a), the four leads on the left form a first one of the receiving-type electrical interconnect components, and the four leads on the right form a second one of the receiving-type electrical interconnect components. FIGS. 23(b) and 23(c), respectively, are front and back views of the first receiving-type electrical interconnect component, i.e., the leftmost electrical interconnect component depicted in FIG. 23(a).

In FIG. 23, a first lead 11 of the first receiving-type electrical interconnect component extends through a well 15 and is SMT-mounted to a bonding pad formed on the inner insulative layer 12c of the multi-layer substrate 10. Second and third leads 11 of the first receiving-type electrical interconnect component extend through respective wells 15 and are each SMT-mounted to a bonding pad formed on the inner insulative layer 12b of the multi-layer substrate 10. A fourth lead of the first receiving-type electrical interconnect component, rather than being associated with a well, is instead SMT-mounted to a bonding pad 13 formed on the top surface of the top insulative layer 12a. In FIG. 23, all four of the leads of the second or rightmost receiving-type electrical interconnect component are bonded to bonding pads 13 formed on the top surface of the upper insulative layer 12a. As with previous configurations, the use of wells in the configuration of FIG. 23 provides for flexibility in the manner in which signals may be transmitted between the various layers of a multi-layer substrate, while refraining from disturbing the lower layers, such as lower insulative layer 12d, through which the wells 15 do not pass.

Figure 24:
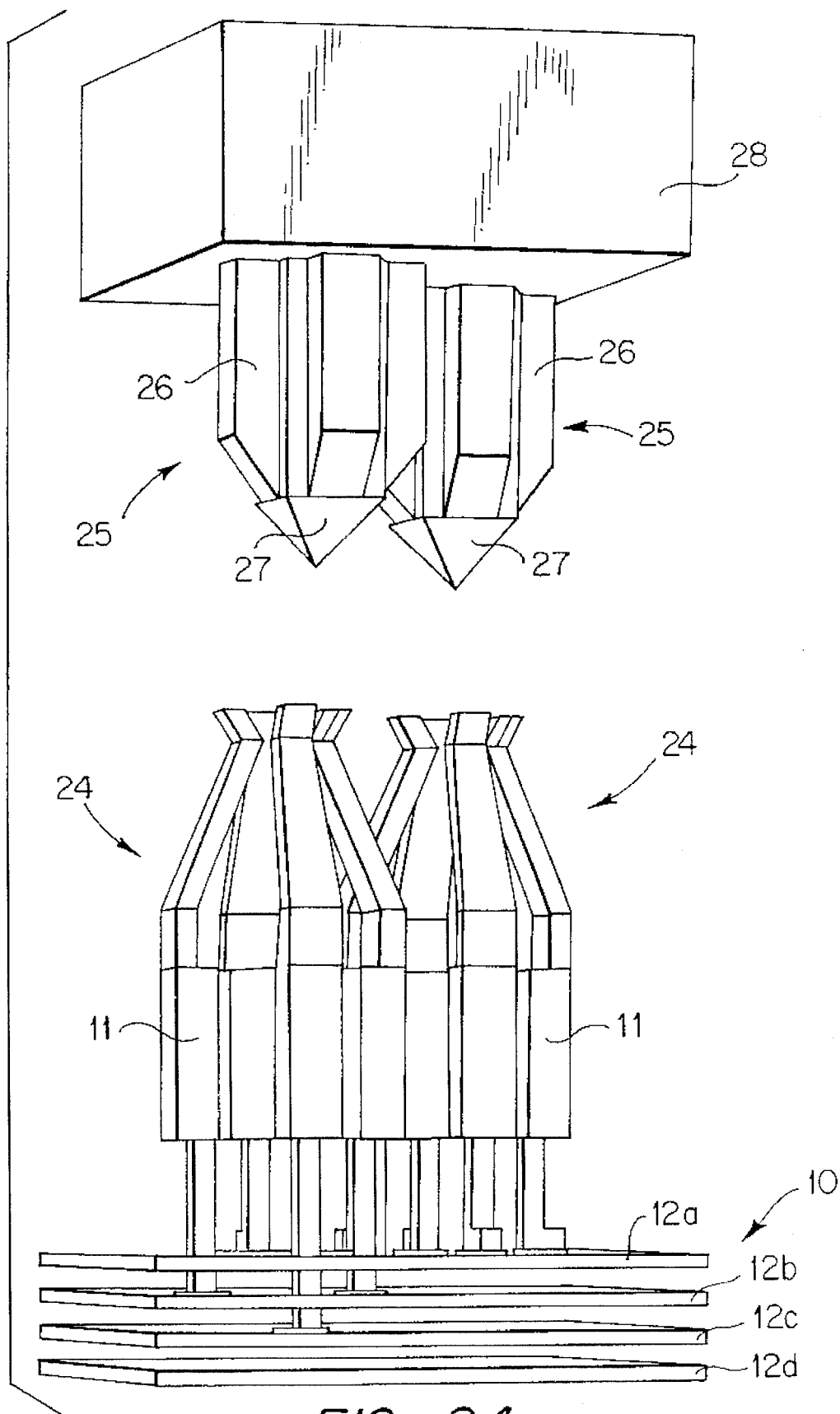
FIG. 24 is a partial perspective view of a plurality of projection-type electrical interconnect components configured for mating with receiving-type electrical interconnect components such as those illustrated in FIG. 23.

FIG. 24 shows a pair of projection-type electrical interconnect components 25 about to be inserted into the receiving-type electrical Interconnect components 24 shown in FIG. 23. Each projection-type electrical interconnect component 25 includes a plurality of conductive contacts or posts 26 arranged so that, if desired, an insulative buttress 27 may be positioned between the contacts. As seen from FIG. 24, the contacts 26 and the buttress 27, if used, may be attached to an electrically insulative substrate 28. The substrate 28 and the buttress 27, if used, insulate the conductive contacts 26 from one another so that a different electrical signal may be transmitted on each contact. Preferably, the material for the buttress 27 and the substrate 28 (and for the insulative substrate for the receiving-type interconnect components, not shown in FIG. 24) is an insulative material that does not shrink when molded (for example, a liquid crystal polymer such as VECTRA, which is a trademark of Hoechst Celanese).

When a projection-type electrical interconnect component is received within a corresponding receiving-type electrical interconnect component, each lead 11 contacts a corresponding one of the contacts 26 for transmission of an electrical signal between each lead 11 and its corresponding contact 26. Although FIG. 24 shows the mounting of receiving-type electrical interconnect components 24 to a multi-layer substrate 10, projection-type electrical interconnect components could just as well be mounted to the multi-layer substrate instead of receiving-type electrical interconnect components to achieve essentially the same effect.

Foot portions of the contacts 26 extend from a side of the substrate 28 opposite the side of the substrate from which the buttress 27, if used, would extend. Such foot portions may be configured for interfacing directly to a semiconductor package, a cable, or some other interface surface. In the event that the projection-type electrical interconnect component is itself part of a semiconductor package or die carrier, that package or carrier would, therefore, be pluggable to the multi-layer substrate 10 in accordance with the present invention. Various types of foot portions envisioned for use in connection with the present invention are described in the aforementioned copending U.S. patent application to Stanford W. Crane, Jr., et al., entitled "SEMICONDUCTOR CHIP CARRIER AFFORDING A HIGH-DENSITY EXTERNAL INTERFACE," filed on even date herewith, and expressly incorporated herein by reference; in a copending U.S. patent application to Stanford W. Crane, Jr., entitled "HIGH-DENSITY ELECTRICAL INTERCONNECT SYSTEM," filed on even date herewith, and expressly incorporated by reference; and in a copending U.S. patent application by Stanford W. Crane, Jr., entitled "HIGH-DENSITY ELECTRICAL INTERCONNECT SYSTEM," filed on Dec. 1, 1992, and expressly incorporated herein by reference. Moreover, various different electrical interconnect component configurations and various nested and modified configurations for electrical interconnect components available for use in connection with the present invention, are also disclosed in these copending applications.

Figure 25:
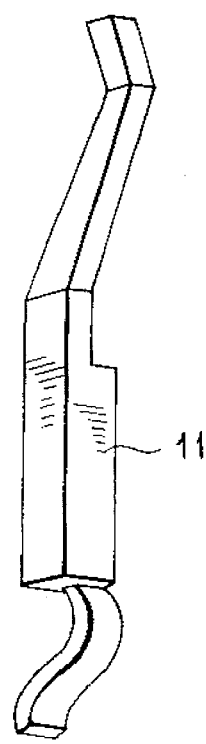
FIG. 25 is a perspective view of a lead foot portion including a corner section to be SMT-mounted to a multi-layer substrate configured in accordance with the present invention.

Various configurations are possible for the portion of each lead 11 that is SMT-mounted to a multi-layer substrate in accordance with the present invention. As seen from FIG. 22, the portion of each lead that is SMT-mounted to an upper layer of a multi-layer substrate may have a configuration including a corner, and the portion of each lead that is SMT-mounted to an inner layer of a multi-layer substrate may have a straight configuration. FIG. 25 shows another type of foot portion configuration that provides additional springiness to facilitate tolerance to dimensional deviations. The foot portion configurations of FIGS. 22 and 25 could be used together for the various leads of a single component (for example, the receiving-type interconnect component 24 of FIG. 23), or all of the leads of a single component may be shaped in accordance with a single one of those configurations. The foot portions of the lead configurations of FIGS. 22 and 25 are all applicable for SMT-mounting to both outer and inner layers of a multi-layer substrate.

As indicated previously, the leads 11 that are SMT-mounted to a multi-layer substrate 10 in accordance with the present invention may correspond to the contacts of a projection-type electrical interconnect component, with each projection-type electrical interconnect component being mounted to the multi-layer substrate and extending from the conductor for receipt within a corresponding receiving-type electrical interconnect component. The projection-type electrical interconnect components may extend in a straight line away from the multi-layer substrate 10 or, alternatively, may be oriented for positioning at a right angle with respect to the multi-layer substrate 10, as shown in FIGS. 26(a) and 26(b), collectively referred to herein as "FIG. 26."

Figure 26A:
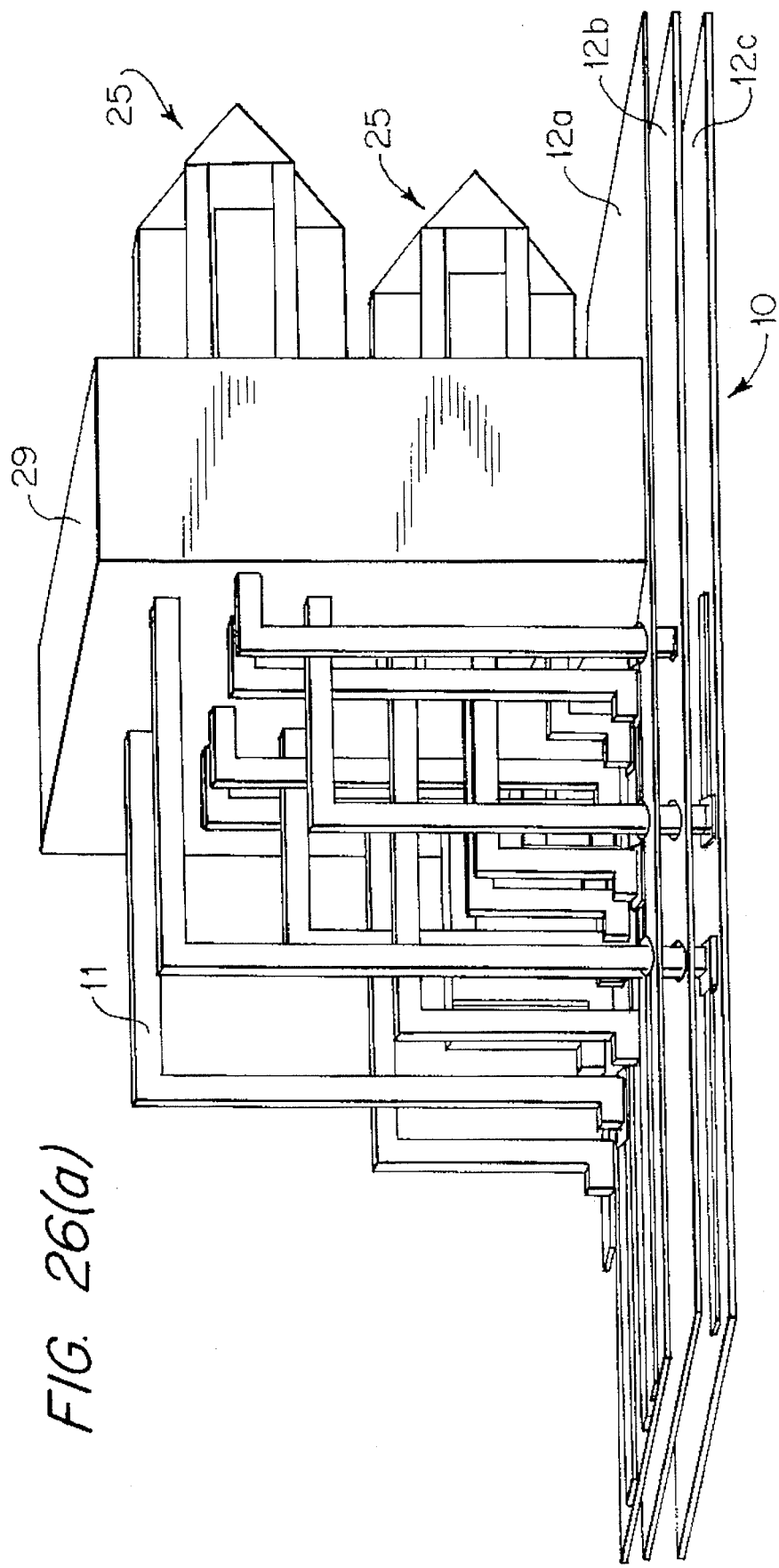
FIG. 26(a) is a partial perspective view of projection-type electrical interconnect components configured for use in connection with a multi-layer substrate in accordance with the present invention.
Figure 26B:
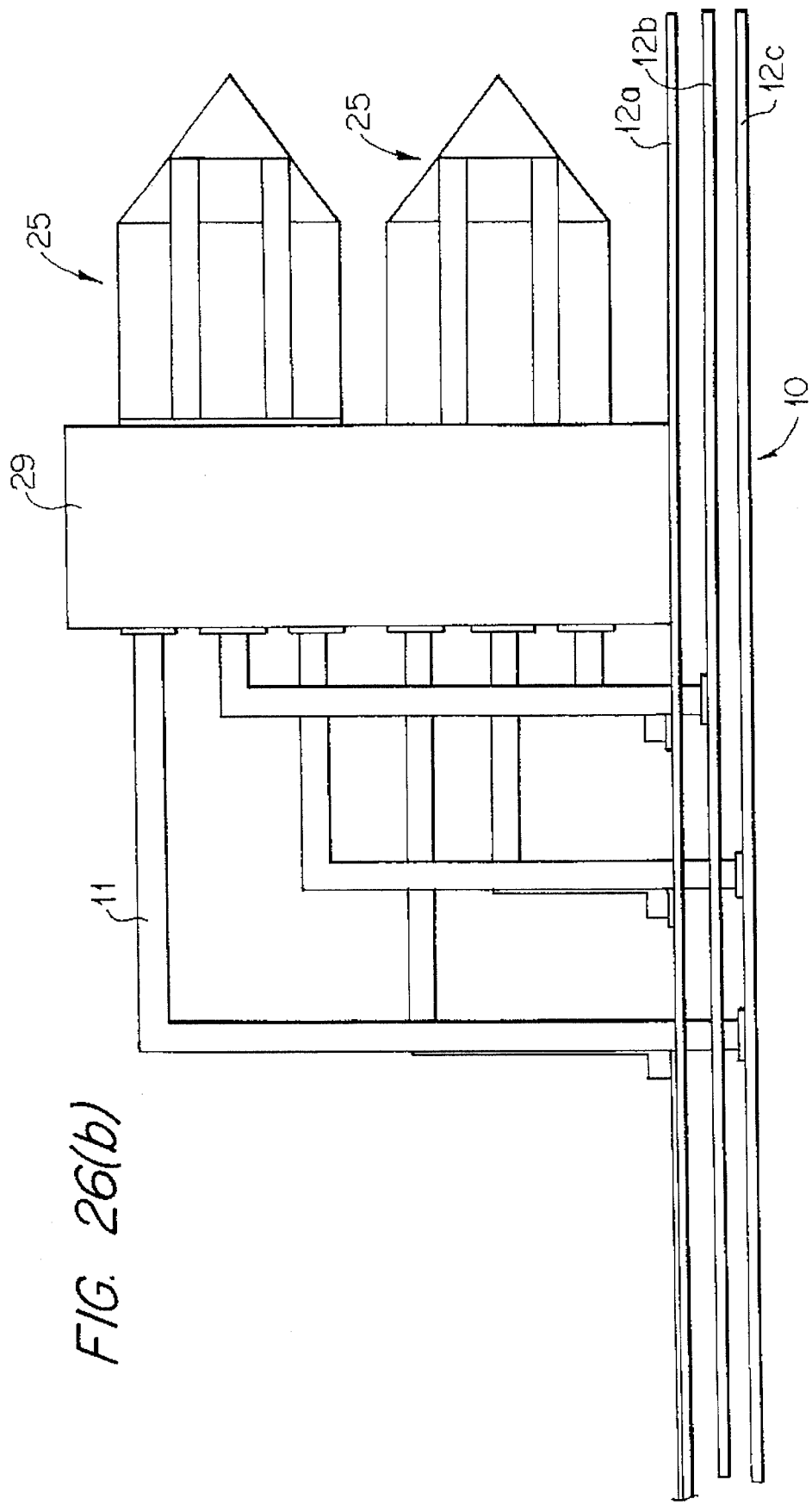
FIG. 26(b) is a partial side view of projection-type electrical interconnect components configured for use in connection with a multi-layer substrate in accordance with the present invention.

FIG. 26(a) is a partial perspective view of bent leads 11 terminating in projection-type electrical interconnect components 25, and FIG. 26(b) is a partial side view of the configuration illustrated in FIG. 26(a). In accordance with the configuration illustrated in FIG. 26, each of the leads has a vertical portion that extends in a straight line away from the multi-layer substrate 10, and then turns into a horizontal portion positioned parallel to the multi-layer substrate. As seen most clearly in FIG. 26(b), the vertical portions of the leads 11 are of different lengths to allow SMT-mounting on various layers of the multi-layer substrate. The horizontal portions of the leads 11 extend into a substrate 29 positioned at a right angle with respect to the multi-layer substrate 10. This increases space efficiency and can facilitate cooling of the components on the multi-layer substrate and/or shorten various signal paths. The horizontal portions also allow for some springiness to make the entire interface system more tolerable to dimensional deviations.

Heretofore, although the present invention has been disclosed broadly as pertaining to multi-layer substrates in general, some of the foregoing discussion has been directed to a specific kind of multi-layer substrate, i.e., a PCB. It should be noted again that all of the features discussed above in connection with PCBs are also applicable to other types of multi-layer substrates, such as FFCs, multi-layer ceramic conductors, multi-layer substrates used within semiconductor packages, and the like. For example, the present invention is applicable to multi-layer substrates made of ceramic, plastic (as in flex circuits), or other insulative materials manufactured by lamination. Thus, PCBs, multi-layer ceramics, multi-layer ceramic conductors designed for use within semiconductor packages, and like multi-layer substrates, are all within the spirit and scope of the present invention.

Figure 27A:
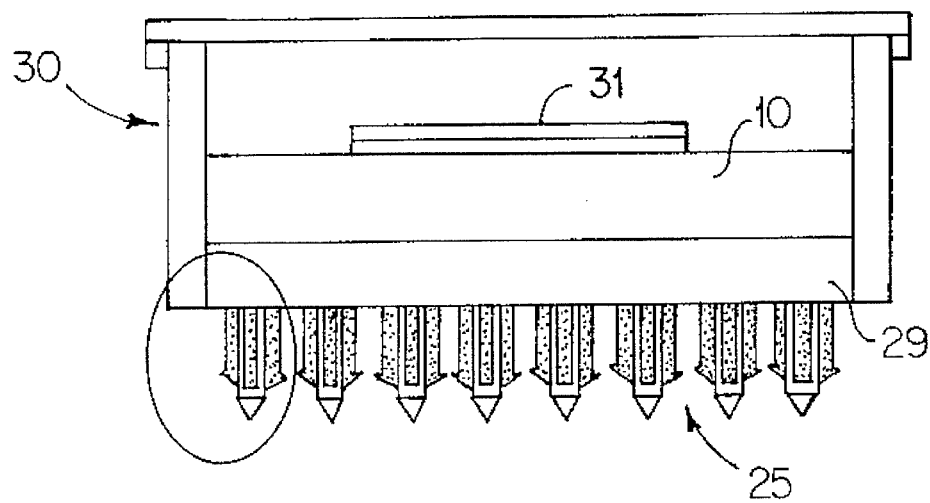
FIG. 27(a) is a side view of a semiconductor die carrier configured in accordance with the present invention.
Figure 27B:
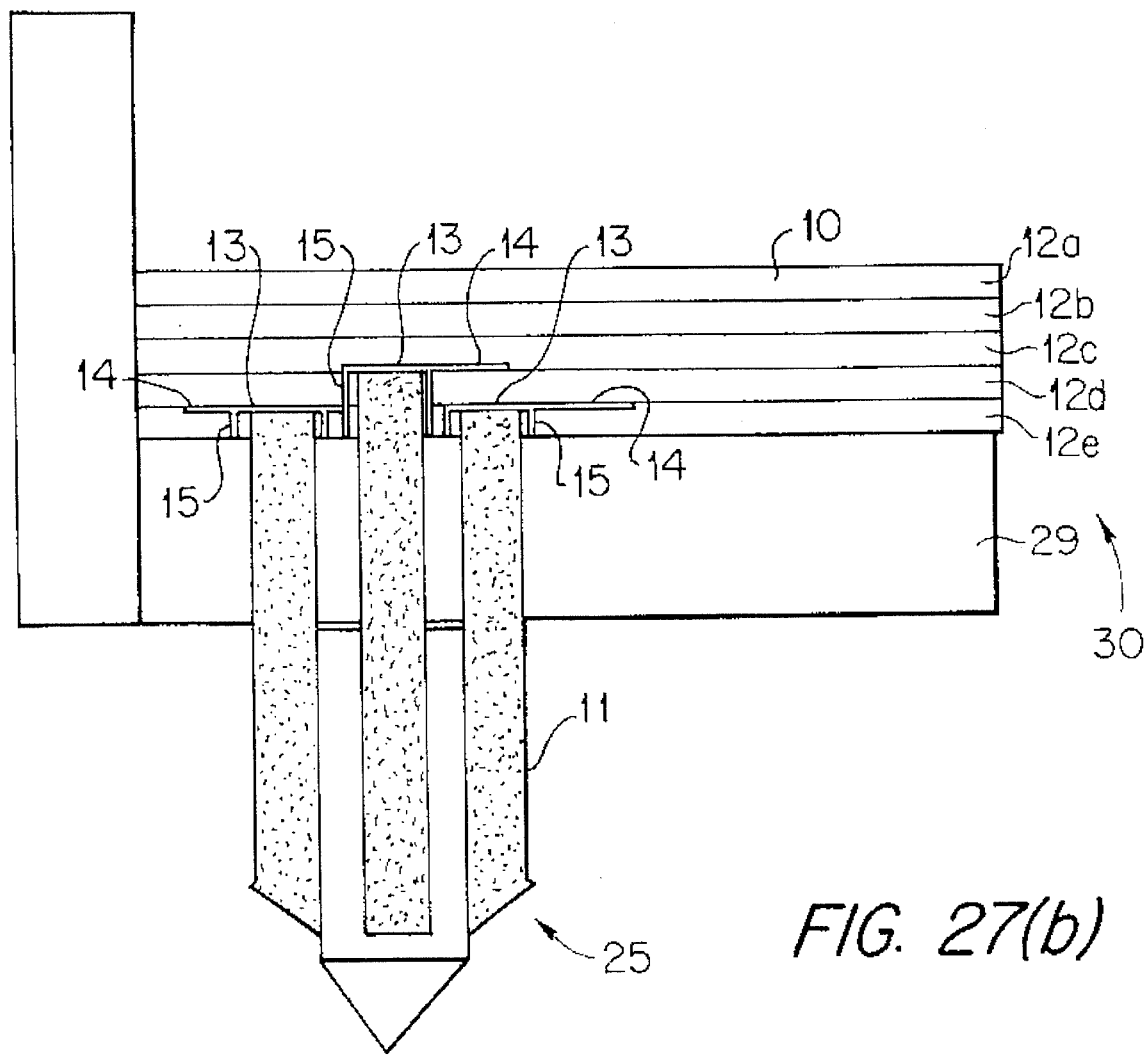
FIG. 27(b) is a partial side view of the semiconductor die carrier of FIG. 27(a) showing wells and leads of different lengths that are SMT-mounted to various layers of a multi-layer substrate incorporated within the semiconductor die carrier.

FIG. 27(a) is a side view of a semiconductor die carrier 30 in accordance with the present invention. FIG. 27(b) is a side view of the portion of the semiconductor die carrier 30 that is circled in FIG. 27(a). Details relating to the semiconductor die carrier can be understood from the aforementioned copending U.S. patent application to Stanford W. Crane, Jr., et al., entitled "SEMICONDUCTOR CHIP CARRIER AFFORDING A HIGH-DENSITY EXTERNAL INTERFACE," filed on even date herewith, and expressly incorporated herein by reference.

The semiconductor die carrier 30 includes a semiconductor die 31 mounted to a multi-layer substrate 10 via one of the wire bonding, tape-automated bonding (TAB), or controlled collapse die connection (C4) bonding techniques. The multi-layer substrate 10 may be a multi-layer ceramic conductor, for example, having ceramic layers 12a, 12b, 12c, 12d, and 12e. Wells 15, which may be plated, unplated with an annular ring, or unplated without an annular ring, are formed in the multi-layer substrate 10. A bonding pad 13 is formed within each well on an inner layer of the multi-layer substrate 10.

The semiconductor die carrier 30 includes a plurality of projection-type interconnect components 25 each of which may be plugged into a corresponding receiving-type interconnect component (such as one of the receiving-type interconnect components 24 shown in FIG. 23). In this manner, the semiconductor die carrier 30 may be plugged onto a PCB or other multi-layer substrate having receiving-type interconnect components mounted thereto. Each of the projection-type interconnect components 25 of the semiconductor die carrier 30 includes a plurality of leads 11. A foot portion of each lead 11 extends into a corresponding well 15 in direct physical contact with the bonding pad 13 formed within the corresponding well. The foot portion of each lead 11 is soldered to its corresponding bonding pad 13, and each well 15 may be partially or completely filled with solder. Traces 14 are formed on the layers of the multi-layer substrate 10 to allow the transmission of electrical signals between the leads 11 of the projection-type interconnect component 25 and the conductive portions of the semiconductor die 31.

As seen from FIGS. 27(a) and 27(b), the multi-layer substrate and leaded component aspects of the present invention are applicable not only to PCBs or other multi-layer substrates upon which semiconductor packages or other components may be mounted, but also to multi-layer substrates within semiconductor packages and other like components. Thus, the present invention is capable of providing advantages and increasing performance at many levels of multi-layer substrate interface technology.

As discussed above, the present invention provides advantages over conventional multi-layer substrate interface technology. Such advantages include the superior use of the surface and inner layers of a multi-layer substrate, vastly improved routeability, and the provision of an apparatus capable of meeting the needs of existing and contemplated semiconductor and computer technology. The advantages provided by the present invention over conventional substrate interface technology illustrate that the present invention, unlike conventional substrate interface technology, is capable of keeping pace with the rapid advances that are currently taking place in the semiconductor and computer technologies.

It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A multi-layer substrate comprising:
    a plurality of layers of insulative material, including at least an upper layer and a lower layer;
    at least one well formed in at least one of the layers, the well extending from an outer surface of the multi-layer substrate to an inner surface of the multi-layer substrate; and
    a surface-mount-compatible bonding pad formed within each well on the inner surface of the multi-layer substrate, wherein leads of an electrical interconnect component are mounted within each well.

2. A multi-layer substrate according to claim 1, wherein the electrical interconnect component is a projection-type electrical interconnect component.

3. A multi-layer substrate according to claim 1, wherein the electrical interconnect component is a receiving-type electrical interconnect component.

4. A semiconductor die carrier package comprising:
    a semiconductor die;
    a plurality of conductive leads; and
    a multi-layer structure for carrying electrical signals between the semiconductor die and the leads, the multi-layer structure comprising
        a plurality of layers of insulative material, each of the layers including a first surface and a second surface located opposite the first surface on an opposing side of the layer; and
        for each of the leads, a corresponding well extending completely through at least one of the layers and bottoming at one of the surfaces of one of the layers through which the well does not extend, and an electrically conductive bonding structure formed at the bottom of the well, each of the leads extending into its corresponding well and being electrically coupled to the electrically conductive bonding structure formed at the bottom of its corresponding well.

5. The semiconductor die carrier package according to claim 4, wherein the multi-layer structure is a multi-layer ceramic conductor.

6. The semiconductor die carrier package according to claim 4, wherein each of the wells has a depth, and not all of the wells have the same depth.

7. A semiconductor die carrier package comprising:
    a plurality of conductive leads; and
    a multi-layer structure for carrying electrical signals, the multi-layer structure comprising:
    a plurality of layers of insulative material, each of the layers including a first surface and a second surface on an opposing side of the layer; and
    for each one of the leads, a corresponding well extending completely through at least one of the layers and bottoming at one of the surfaces of one of the layers through which the well does not extend, each of the leads extending into its corresponding well and being electrically coupled to an electrically conductive bonding structure formed within its corresponding well.

8. A semiconductor die carrier package according to claim 7, wherein the multi-layer structure is a multi-layer ceramic conductor.

9. A semiconductor die carrier package according to claim 7, wherein each of the wells has a depth, and not all of the wells have the same depth.

10. A semiconductor die carrier package according to claim 7, further comprising a semiconductor die mounted within the semiconductor die carrier package.

11. A semiconductor die carrier package according to claim 10, wherein the multi-layer structure carries electrical signals between the semiconductor die and the leads.

12. A semiconductor die carrier package according to claim 7, wherein each electrically conductive bonding structure is formed at the bottom of its corresponding well.

13. A semiconductor die carrier package according to claim 7, wherein at least one of the wells is plated with conductive material.

14. A semiconductor die carrier package according to claim 13, further comprising an electrically conductive annular ring formed around at least one of the wells on an outer surface of the multi-layer structure.

15. A semiconductor die carrier package according to claim 7, wherein at least one of the wells is unplated.

16. A semiconductor die carrier package according to claim 15, further comprising an electrically conductive annular ring formed around at least one of the wells on an outer surface of the multi-layer structure.

17. A semiconductor die carrier package according to claim 7, further comprising solder that fills each of the wells.

18. A semiconductor die carrier package according to claim 7, wherein the leads are arranged into groups of leads, and each group of leads is used to form a pluggable electrical interconnect component.

19. A semiconductor die carrier package according to claim 18, wherein each pluggable interconnect component of the semiconductor die carrier package is pluggably connected to a corresponding pluggable electrical interconnect component mounted to a substrate.

20. A semiconductor die carrier package according to claim 18, wherein each of the pluggable electrical interconnect components further comprises an insulative buttress around which the leads of that interconnect component are arranged.

21. A semiconductor die carrier package according to claim 7, further comprising a plurality of discrete insulative buttresses projecting from an outer surface of the package.

22. A semiconductor die carrier package according to claim 21, wherein the leads are arranged into groups of leads, and the leads of each group of leads are arranged around one of the insulative buttresses in close proximity to that buttress.

* * * * *